(12) United States Patent
Kato et al.

(10) Patent No.: US 7,391,083 B2
(45) Date of Patent: Jun. 24, 2008

(54) SEMICONDUCTOR DEVICE AND A METHOD OF MANUFACTURING THE SAME

(75) Inventors: Kunihiko Kato, Tokyo (JP); Masami Koketsu, Tokyo (JP); Shigeya Toyokawa, Tokyo (JP); Keiichi Yoshizumi, Tokyo (JP); Hideki Yasuoka, Tokyo (JP); Yasuhiro Takeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 170 days.

(21) Appl. No.: 11/405,540

(22) Filed: Apr. 18, 2006

(65) Prior Publication Data
US 2006/0237795 A1    Oct. 26, 2006

(30) Foreign Application Priority Data
Apr. 20, 2005    (JP)    ............................. 2005-121974

(51) Int. Cl.
*H01L 23/62*    (2006.01)
(52) U.S. Cl. .................. 257/360; 257/392; 257/491; 257/E27.067
(58) Field of Classification Search ................ 257/360, 257/E27.067
See application file for complete search history.

(56) References Cited

U.S. PATENT DOCUMENTS

| 6,780,717 | B2 | 8/2004 | Yasuoka et al. |
| 7,084,465 | B2 * | 8/2006 | Shibata et al. ............... 257/392 |
| 2002/0064917 | A1 | 5/2002 | Yasuoka et al. |
| 2003/0104671 | A1 | 6/2003 | Yasuoka et al. |
| 2004/0251505 | A1 | 12/2004 | Yasuoka et al. |

FOREIGN PATENT DOCUMENTS

JP    2002-170888 A    6/2002

* cited by examiner

*Primary Examiner*—Tu-Tu Ho
(74) *Attorney, Agent, or Firm*—Miles & Stockbridge P.C.

(57) ABSTRACT

A method of manufacturing a semiconductor integrated circuit device having on the same substrate both a high breakdown voltage MISFET and a low breakdown voltage MISFET is provided. An element isolation trench is formed in advance so that the width thereof is larger than the sum of the thickness of a polycrystalline silicon film serving as a gate electrode of a low breakdown voltage, the thickness of a gate insulating film and an alignment allowance in processing of a gate electrode in a direction orthogonal to the extending direction of the gate electrode and is larger than the thickness of the polycrystalline silicon film in a planar region not overlapping the gate electrode. It is possible to decrease the number of manufacturing steps for the semiconductor integrated circuit device.

10 Claims, 32 Drawing Sheets

US 7,391,083 B2

SEMICONDUCTOR DEVICE AND A METHOD OF MANUFACTURING THE SAME

BACKGROUND OF THE INVENTION

The present invention relates to a semiconductor integrated circuit device and a method of manufacturing the same. Particularly, the present invention is concerned with a technique applicable effectively to a semiconductor integrated circuit device with both high breakdown voltage MISFET (Metal Insulator Semiconductor Field Effect Transistor) and low breakdown voltage MISFET formed on the same semiconductor substrate, as well as a method of manufacturing the same.

In Japanese Unexamined Patent Publication No. 2002-170888 (Patent Literature 1) is disclosed a technique for increasing the drain breakdown voltage by forming an electric field relaxing layer around source and drain regions of a high breakdown voltage MISFET.

[Patent Literature 1]
Japanese Unexamined Patent Publication No. 2002-170888

SUMMARY OF THE INVENTION

The present inventors have been studying a technique for forming both high breakdown voltage MISFET (Metal Insulator Semiconductor Field Effect Transistor) and low breakdown voltage MISFET on the same semiconductor substrate (hereinafter referred to simply as "substrate"). In the course of the study the present inventors found out a problem, which will be described below with reference to FIGS. 31 to 35.

In FIGS. 31 to 35, an A-A region is a region where a high breakdown voltage MISFET is formed, a B-B region is a region where a low breakdown voltage MISFET is formed, and a C-C region is a region where a capacitance is formed. On the substrate shown in FIGS. 31 to 35 there are formed n- and p-channel MISFETs, provided illustration and explanation of the region where the n-channel MISFET is formed are omitted.

For forming both high and low breakdown voltage MISFETs in one and same substrate, first as shown in FIG. 31, an element isolation region 102, an n-type isolation region 103 and a p-type well 104 are formed on a main surface of a substrate 101. Then, as shown in FIG. 32, a silicon oxide film 105 is deposited on the substrate 101 and thereafter the silicon oxide film 105 present in the region where the low breakdown voltage MISFET is to be formed is removed by etching. Next, the region where the low breakdown voltage MISFET is to be formed is oxidized again and a polycrystalline silicon film 106 doped with for example P (phosphorus) is deposited on the substrate 101. Subsequently, the substrate 101 is subjected to a thermal oxidation treatment to form a silicon oxide film on the surface of the polycrystalline silicon film 106, then a silicon nitride film is deposited on the silicon oxide film, followed by a thermal oxidation treatment to form a silicon oxide film on the surface of the silicon nitride film, thereby forming a three-layer insulating film 107 consisting of the silicon oxide film, silicon nitride film and silicon oxide film. Then, the insulating film 107 and the polycrystalline silicon film 106 are subjected to patterning by etching to remove the insulating film 107 and the polycrystalline silicon film 106 in the region where the low breakdown voltage MISFET is to be formed. At this time, in the capacitance-formed region there is formed a lower electrode 106A of a capacitance constituted by the polycrystalline silicon film 106. Next, as shown in FIG. 33, with a photoresist film as a mask, ions such as P (phosphorus) ions are introduced selectively into the substrate 101 to form an n-type semiconductor layer 108 having an n-conductive type impurity in the region where the low breakdown voltage MISFET is to be formed, and n-type well 109 is formed in a region in which a low breakdown voltage MISFET is to be formed. Then, as shown in FIG. 34, a heat treatment is performed for the substrate 101 to form a gate oxide film 110 on the surface of the substrate 101 in the region where the low breakdown voltage MISFET is to be formed. Subsequently, a polycrystalline silicon film is deposited on the substrate 101 and is then subjected to patterning by etching to form a gate electrode 111 of the low voltage MISFET and an upper electrode 112 of a capacitance. Then, as shown in FIG. 35, in the region where the high breakdown voltage MISFET is to be formed, the insulating film 107, polycrystalline silicon film 106 and silicon oxide film 105 are subjected to patterning by etching to form a gate electrode 106B of the high breakdown voltage MISFET. The reason why the gate electrode 111 of the low breakdown voltage MISFET is formed first and thereafter is formed the gate electrode 106B of the high breakdown voltage MISFET is that it is intended to cover the high breakdown voltage MISFET-formed region with the three thin films which are the insulating film 107, polycrystalline silicon 106 and silicon oxide film 105, thereby prevent an unnecessary impurity ion from being introduced into the high breakdown voltage MISFET-formed region in the impurity ion introducing step for the substrate 101 and prevent a lowering in breakdown voltage of the high breakdown voltage MISFET.

However, after going through the above process, the gate electrode 106B of the high breakdown voltage MISFET, the gate electrode 111 of the low breakdown voltage MISFET and the lower electrode 106A as a capacitance are subjected to patterning in separate steps, thus contributing to an increase in the number of steps. Thus, how the number of steps required for processing the gate electrodes 106B, 111 and the lower electrode 106A as a capacitance is to be reduced now poses a problem.

It is an object of the present invention to provide a technique able to reduce the number of manufacturing steps for a semiconductor integrated circuit device with both high and low breakdown voltage MISFETs formed on the same substrate.

The above and other objects and novel features of the present invention will become apparent from the following description and the accompanying drawings.

The following is an outline of typical modes of the present invention as disclosed herein.

In one aspect of the present invention there is provided a semiconductor integrated circuit device comprising, on one and same substrate, a first MISFET of a first breakdown voltage and a second MISFET of a second breakdown voltage lower than the first breakdown voltage, wherein the first MISFET has on the semiconductor substrate a first semiconductor region where a first gate electrode constituted by a first conductive film, a first gate insulating film, a source and a drain are formed, the second MISFET has on the semiconductor substrate a second gate electrode constituted by a second conductive film, and an element isolation region is formed in the semiconductor substrate at a position under a side wall of the first gate electrode, the width of the element isolation region in a first direction orthogonal to the extending direction of the first gate electrode being larger than the thickness of the second conductive film in a planar region not overlapping the first gate electrode.

In another aspect of the present invention there is provided a method of manufacturing a semiconductor integrated circuit device having on one and same semiconductor substrate both a first MISFET of a first breakdown voltage formed in a first region and a second MISFET of a second breakdown voltage lower than the first breakdown voltage formed in a second region, comprising the steps of:

(a) forming an element isolation region in a main surface of the semiconductor substrate;

(b) introducing an impurity ion into the first region of the semiconductor substrate to form a first semiconductor region where a source and a drain of the first MISFET are formed;

(c) forming a first gate insulating film on the main surface of the first region of the semiconductor substrate;

(d) depositing a first conductive film on the first gate insulating film and patterning the first conductive film to form a first gate electrode of the first MISFET in the first region;

(e) after the step (d), forming a second gate insulating film on the main surface of the second region of the semiconductor substrate;

(f) depositing a second conductive film on the second gate insulating film and patterning the second conductive film to form a second gate electrode of the second MISFET in the second region; and (g) introducing an impurity ion into the second region of the semiconductor substrate to form a third semiconductor region serving as a source and a drain of the second MISFET, wherein the element isolation region is disposed under a side wall of the first gate electrode and is formed in such a manner that the width thereof in a direction orthogonal to the extending direction of the first gate electrode is larger than the thickness of the second conductive film in a planar region not overlapping the first gate electrode.

In a further aspect of the present invention there is provided a method of manufacturing a semiconductor integrated circuit device having on one and same semiconductor substrate both a first MISFET formed in a first region and a second MISFET formed in a second region, the first MISFET having a first breakdown voltage as a drain breakdown voltage and a second breakdown voltage as a source breakdown voltage lower than the first breakdown voltage, the second MISFET having a well of the same breakdown voltage as the source breakdown voltage which is the second breakdown voltage, comprising the steps of:

(a) forming an element isolation region in a main surface of the semiconductor substrate;

(b) introducing an impurity ion into the first region of the semiconductor substrate to form a first semiconductor region where the drain of the first MISFET is formed;

(c) forming a first gate insulating film on the main surface of the first region of the semiconductor substrate;

(d) depositing a first conductive film on the first gate insulating film and patterning the first conductive film to form a first gate electrode of the first MISFET in the first region;

(e) introducing an impurity ion into the semiconductor substrate to form a first well region in the second region and form in the first region a second semiconductor region where the source of the first MISFET is formed;

(f) introducing an impurity ion into a lower portion of the second semiconductor region to expand the second semiconductor region deeper than the element isolation region;

(g) after the step (d), forming a second gate insulating film on the main surface of the second region of the semiconductor substrate;

(h) depositing a second conductive film on the second gate insulating film and patterning the second conductive film to form a second gate electrode of the second MISFET in the second region; and (i) introducing an impurity ion into the second region of the semiconductor substrate to form a third semiconductor region serving as a source and a drain of the second MISFET, wherein the element isolation region is disposed under a side wall of the first gate electrode and is formed in such a manner that the width thereof in a first direction orthogonal to the extending direction of the first gate electrode is larger than the thickness of the second conductive film in a planar region not overlapping the first gate electrode.

The following is a brief description of an effect obtained by the typical modes of the present invention as disclosed herein.

It is possible to decrease the number of manufacturing steps for a semiconductor integrated circuit device with both high and low breakdown voltage MISFETs formed on the same substrate.

DETAILED DESCRIPTION OF THE PREFERRED EMBODIMENTS

Figure 1:
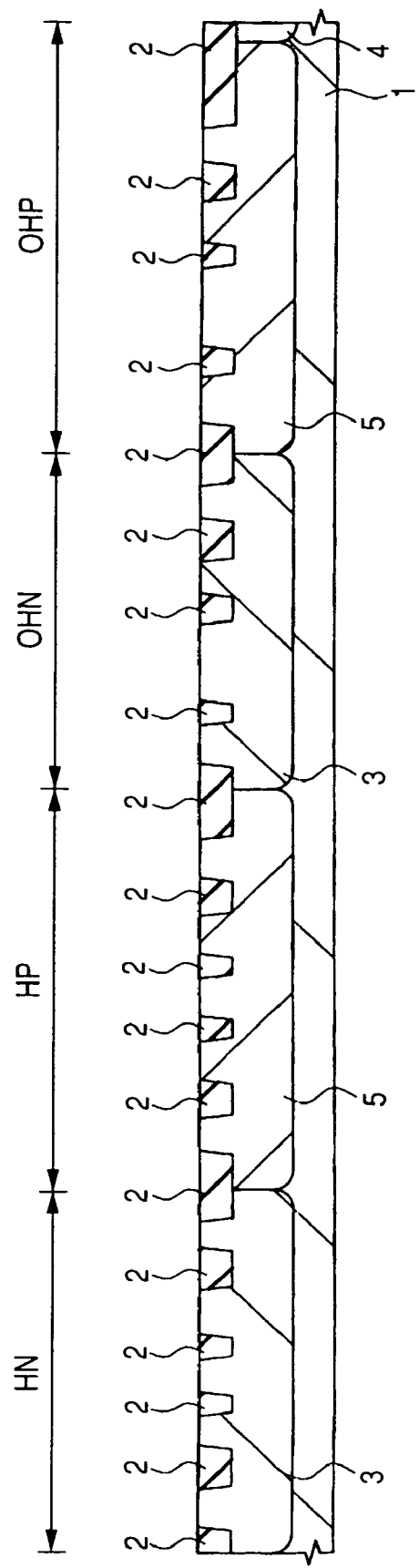
FIG. 1 is a sectional view of principal portions, illustrating a semiconductor integrated circuit device manufacturing method for comparison with a semiconductor integrated circuit device manufacturing method according to an embodiment of the present invention.

An embodiment of the present invention will be described hereinunder with reference to the accompanying drawings. In all of the drawings for illustrating the embodiment, the same members are identified by the same reference numerals in principle, repeated explanations thereof will be omitted.

A semiconductor integrated circuit device related to this embodiment includes an LCD (Liquid Crystal Display) driver for example. Before describing a semiconductor integrated circuit device manufacturing process according to this embodiment, a description will be given with reference to FIGS. 1 to 12 about a semiconductor integrated circuit device manufacturing process for comparison with the process embodying the invention.

Figure 2:
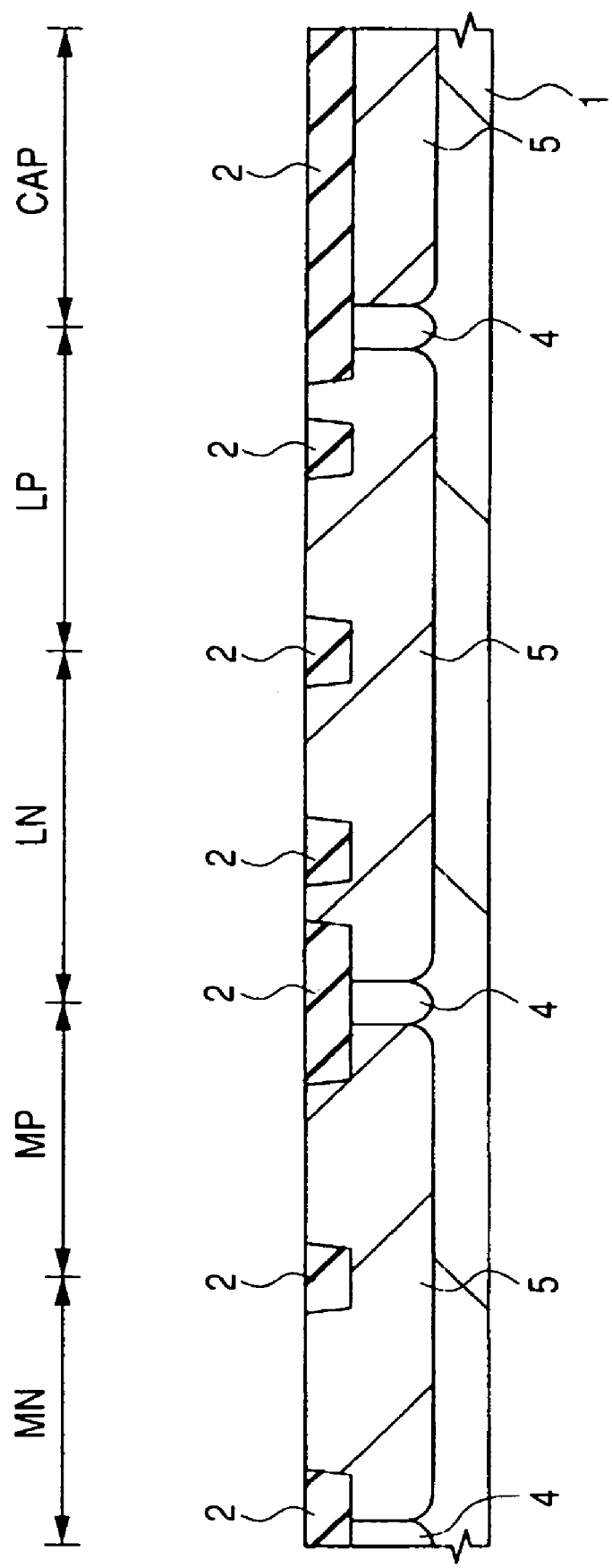
FIG. 2 is a sectional view of principal portions, illustrating the comparative method.

In the semiconductor integrated circuit device manufacturing process as a comparative process, as shown in FIGS. 1 to 12, first an element isolation trench (element isolation region) 2 is formed in a main surface of a semiconductor substrate (hereinafter referred to simply as "substrate") 1 which is constituted, for example, by a p-type single crystal silicon. In FIGS. 1 and 2, indicated at HN is a region where an n-channel MISFET of a high breakdown voltage (about 27V to 37V (first breakdown voltage)) is formed, indicated at HP is a region where a p-channel MISFET of a high breakdown voltage is formed, indicated at OHN is a region (first region) where an n-channel MISFET (first MISFET) of a high drain breakdown voltage is formed, indicated at OHP is a region (first region) where a p-channel MISFET (first MISFET) of a high drain breakdown voltage is formed, indicated at MN is a region where an n-channel MISFET of a medium breakdown voltage (about 6V) is formed, indicated at MP is a region where a p-channel MISFET of a medium breakdown voltage is formed, indicated at LN is a region (second region) where an n-channel MISFET of a low breakdown voltage (about 1.5V (second breakdown voltage)) is formed, indicated at LP is a region (second region) where a p-channel MISFET (second MISFET) of a low breakdown voltage is formed, and indicated at CAP is a region where a capacitance element is formed.

The n-channel MISFET in OHN region is formed to have the same drain structure but a different source structure in comparison with the n-channel MISFET in HN region. In the case of the drain of the n-channel MISFET in OHN region, the element isolation region 2 is formed within the region so that the drain can withstand up to a high breakdown voltage against an electric field generated between the gate electrode and the drain. As to the source, since a lower voltage than that for the drain is applied thereto, a required breakdown voltage is ensured even without forming such an element isolation region 2 as in the drain structure within the region thereof. This is also the case with the p-channel MISFET in OHP region. By thus forming the MISFETs in OHN and OHP regions it is possible to effect a reduced-size layout of the source region. That is, in the gate length direction, the length of the source region can be made smaller than that of the drain region. Consequently, it is possible to promote the microfabrication of the semiconductor device.

For forming the element isolation trench 2 there is adopted, for example, a method involving dry-etching the main surface of the substrate 1 to form a trench, then depositing an insulating film such as a silicon oxide film onto the substrate 1 including the interior of the trench by a CVD (Chemical Vapor Deposition) method, and thereafter polishing the unnecessary insulating film present outside the trench by a CMP (Chemical Mechanical Polishing) method to remove the unnecessary insulating film, thereby allowing the insulating film to remain in the interior of the trench. By forming the element isolation trench 2, an active region whose circumference is defined by the element isolation region 2 is formed on the main surface of the substrate 1.

Subsequently, with a photoresist film as a mask, ions such as, for example, B (boron) or $BF_2$ (boron difluoride) ions are introduced into the substrate 1 with use of energy of about 200 keV to form a first p-type well 3 having an impurity which exhibits p-type conductivity, as well as a p-type isolation region 4. After subsequent removal of the photoresist film used in forming the first p-type well 3 and p-type isolation region 4, a photoresist film is again used as a mask and for example P (phosphorus) or As (arsenic) ions are introduced into the substrate 1 with use of an energy of about 360 keV to form a first n-type well 5 having an impurity which exhibits n-type conductivity.

Figure 3:
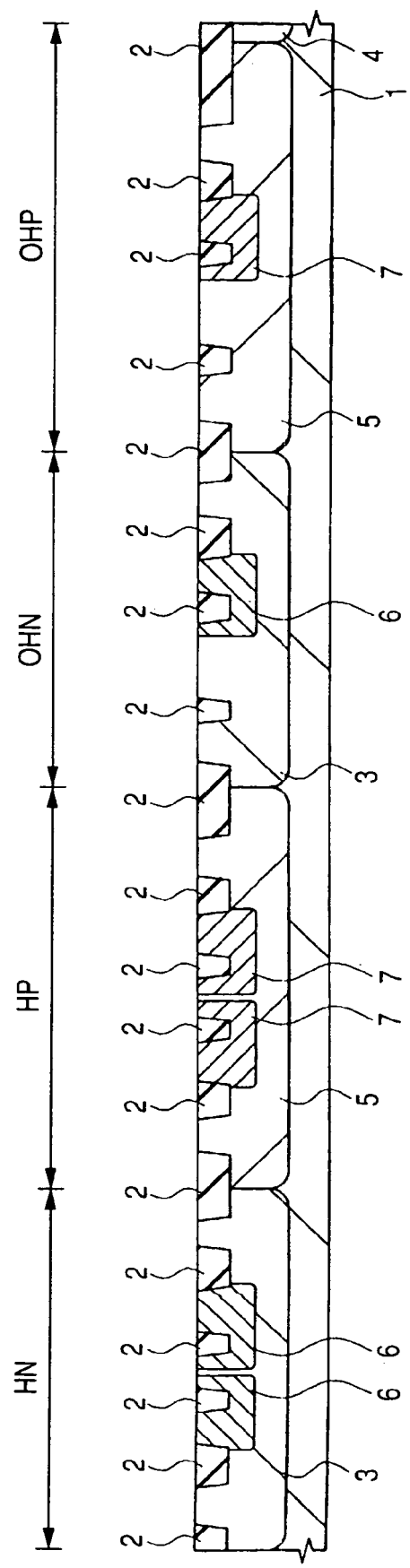
FIG. 3 is a sectional view of principal portions in a semiconductor integrated circuit device manufacturing step which follows FIG. 1.

Next, as shown in FIG. 3, using a photoresist film as a mask, ions such as, for example, P or As ions are introduced into the substrate 1 with use of energy of about 360 kev to form in HN and OHN regions a second n-type well 6 having an impurity which exhibits n-type conductivity. Subsequently, the photoresist film used in forming the second n-type well 6 is removed and thereafter, using again a photoresist film as a mask, ions such as, for example, B or $BF_2$ ions are introduced into the substrate 1 with use of energy of about 200 keV to form in HP and OHP regions a second p-type well 7 having an impurity which exhibits p-type conductivity.

Figure 4:
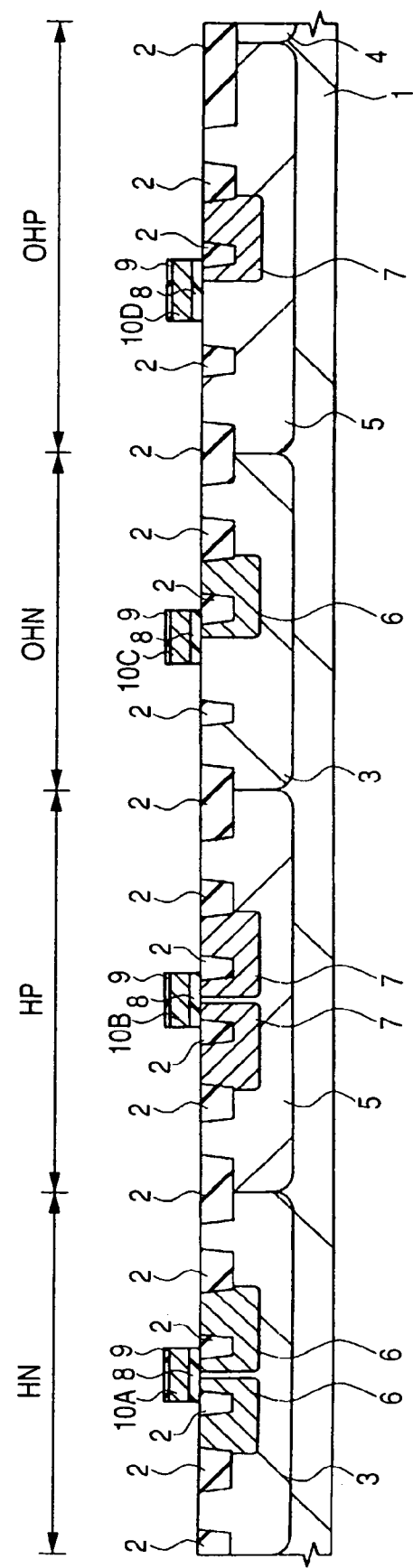
FIG. 4 is a sectional view of principal portions in a semiconductor integrated circuit device manufacturing step which follows FIG. 3.
Figure 5:
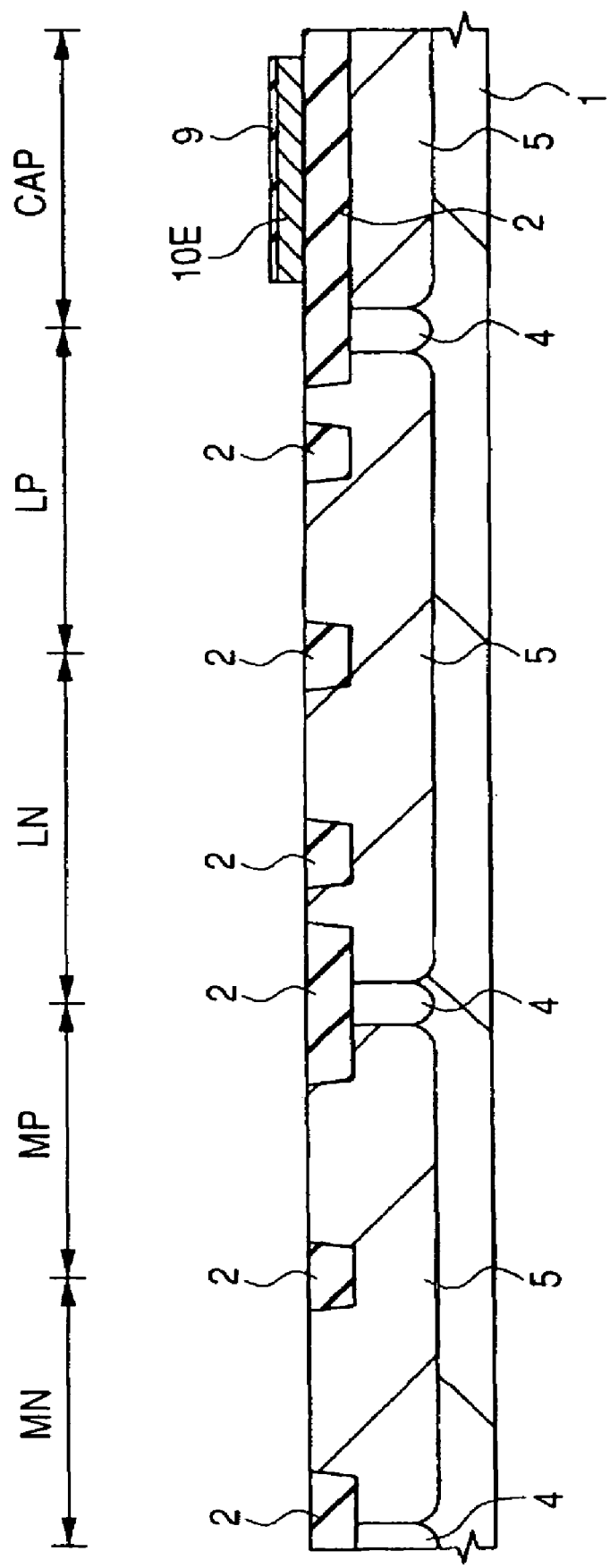
FIG. 5 is a sectional view of principal portions, illustrating the comparative method.

Then, as shown in FIGS. 4 and 5, an oxidation treatment is applied to the substrate 1 and thereafter a silicon oxide film is deposited on the main surface of the substrate 1 by CVD (Chemical Vapor Deposition) to form a gate insulating film 8. Subsequently, in the gate insulating film 8, the silicon oxide film deposited by CVD is subjected to patterning through a photoresist film as a mask, allowing the gate insulating film (first gate insulating film) 8 to remain in HN, HP, OHN and OHP regions.

Next, a polycrystalline silicon film (first conductive film) doped with an impurity such as P or As is deposited on the substrate 1. Then, a thermal oxidation treatment is applied to the polycrystalline silicon film to form a silicon oxide film on the surface thereof. Subsequently, a silicon nitride film is deposited on the silicon oxide film and then a thermal oxidation treatment is applied to the silicon nitride film to form a silicon oxide film on the surface thereof. In this way there is formed an insulating film 9 consisting of three layers which are silicon oxide film, silicon nitride film and silicon oxide film. Next, the silicon nitride film and the polycrystalline silicon film are subjected to patterning through dry etching with a photoresist film as a mask to form a gate electrode 10A in HN region, a gate electrode 10B in HP region, a gate electrode (first gate electrode) 10C in OHN region, a gate electrode (first gate electrode) 10D in OHP region, and a lower electrode 10E as a capacitance element in CAP region.

Figure 6:
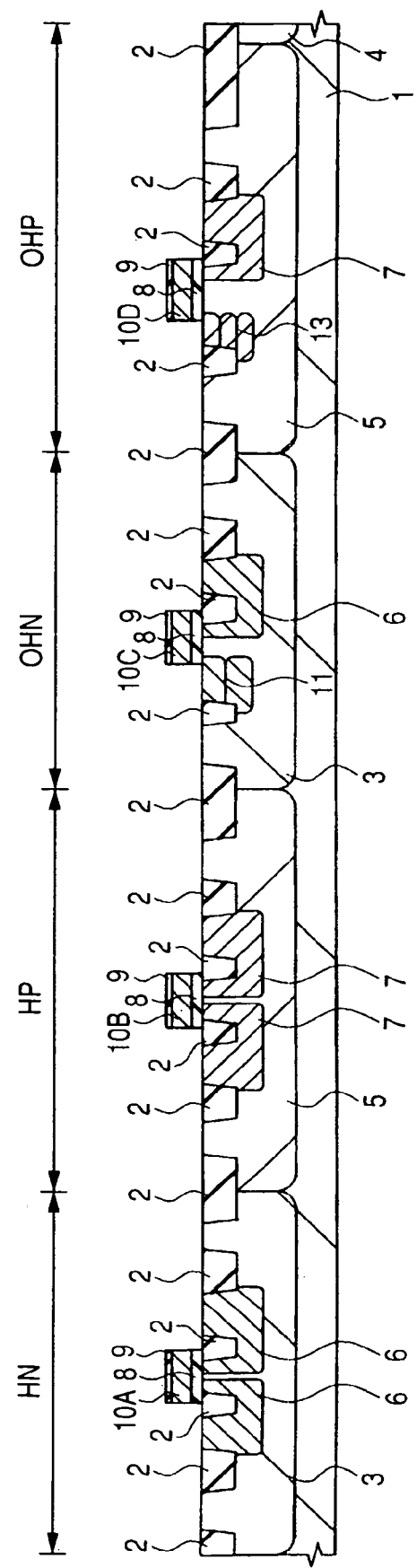
FIG. 6 is a sectional view of principal portions in a semiconductor integrated circuit device manufacturing step which follows FIG. 4.
Figure 7:
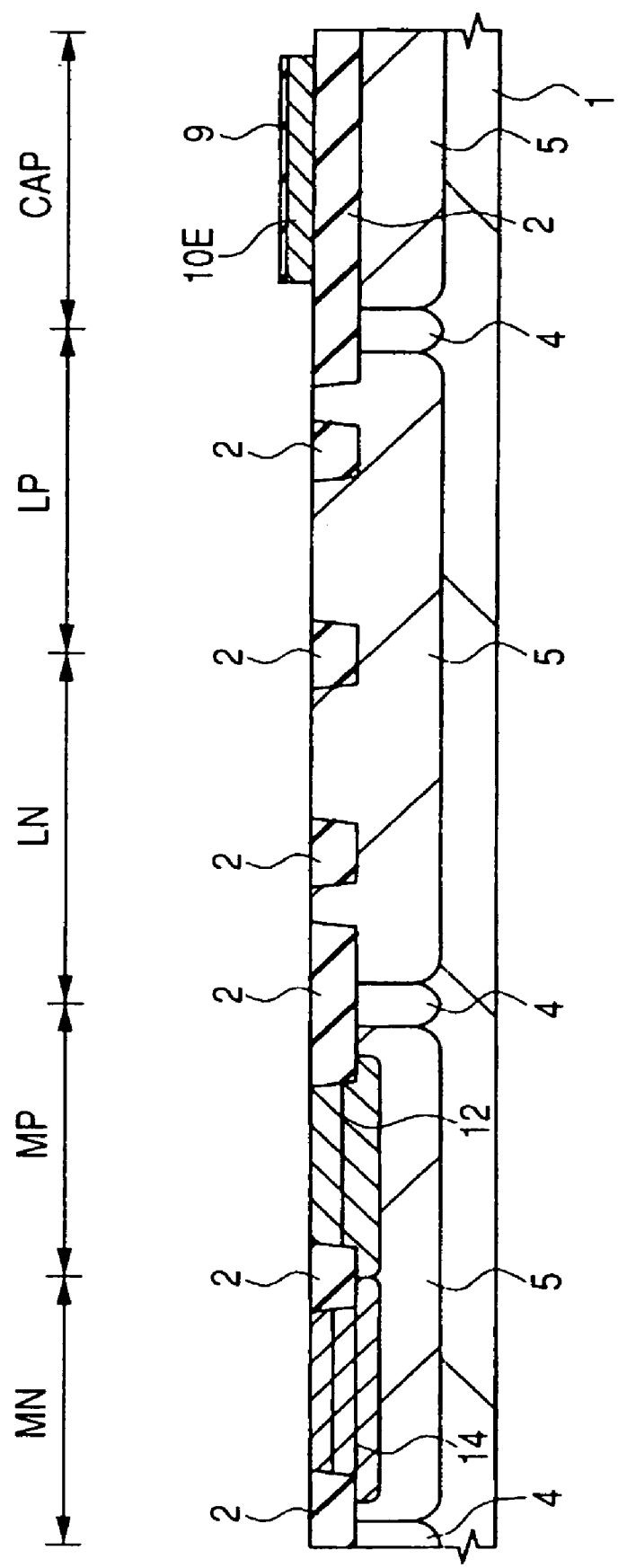
FIG. 7 is a sectional view of principal portions in a semiconductor integrated circuit device manufacturing step which follows FIG. 5.

Then, as shown in FIGS. 6 and 7, using a photoresist film as a mask, ions such as, for example, P or As ions are introduced into OHN and MP regions to form in OHN region a third n-type well 11 having an impurity which exhibits n-type conductivity and form in MP region a fourth n-type well 12 having an impurity which exhibits n-type conductivity. At this time, the introduction of such ions as P or As ions into the substrate 1 is performed dividedly in plural times (e.g., three times) and the depth of ion introduction is controlled every time by changing the ion introducing energy each time. By so doing it becomes possible to prevent an unnecessary diffusion of impurity in comparison with means which diffuses impurity within the substrate 1 by heat treatment.

Subsequently, the photoresist film which has been used in forming the third and fourth n-type wells 11, 12 is removed and thereafter, using a photoresist film again as a mask, ions such as, for example, B or $BF_2$ are introduced into the OHP and MN regions to form in OHP region a third p-type well 13 having an impurity which exhibits p-type conductivity and form in MN region a fourth p-type well 14 having an impurity which exhibits p-type conductivity. Also at this time, the introduction of such ions as B or $BF_2$ ions into the substrate 1 is performed dividedly in plural times as in the formation of the third and fourth n-type wells 11, 12 and the depth of ion introduction is controlled every time by changing the ion introducing energy each time.

Figure 8:
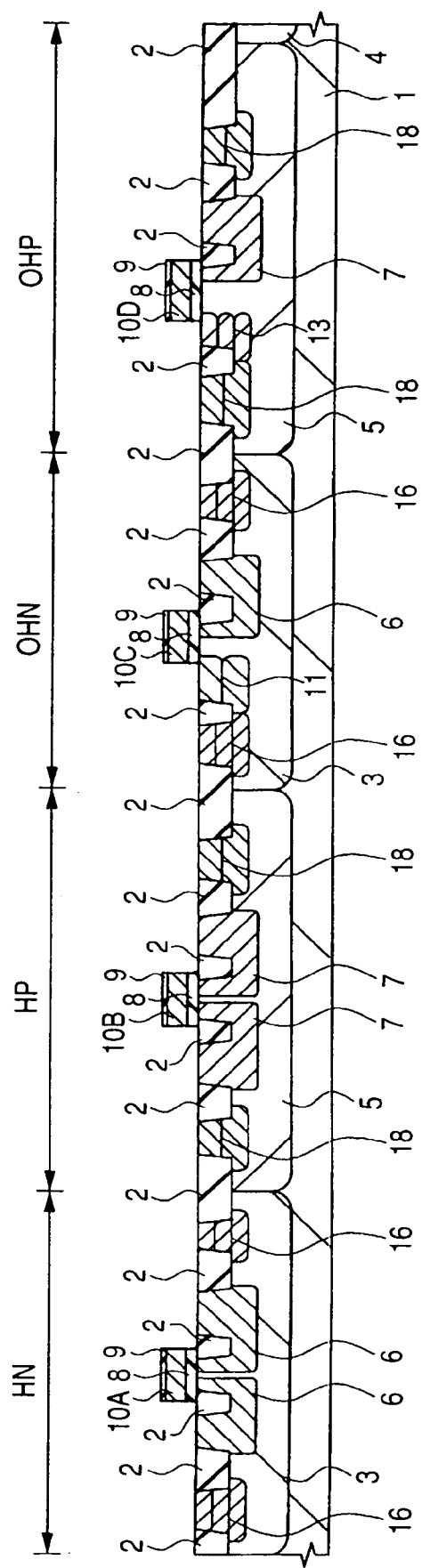
FIG. 8 is a sectional view of principal portions in a semiconductor integrated circuit device manufacturing step which follows FIG. 6.
Figure 9:
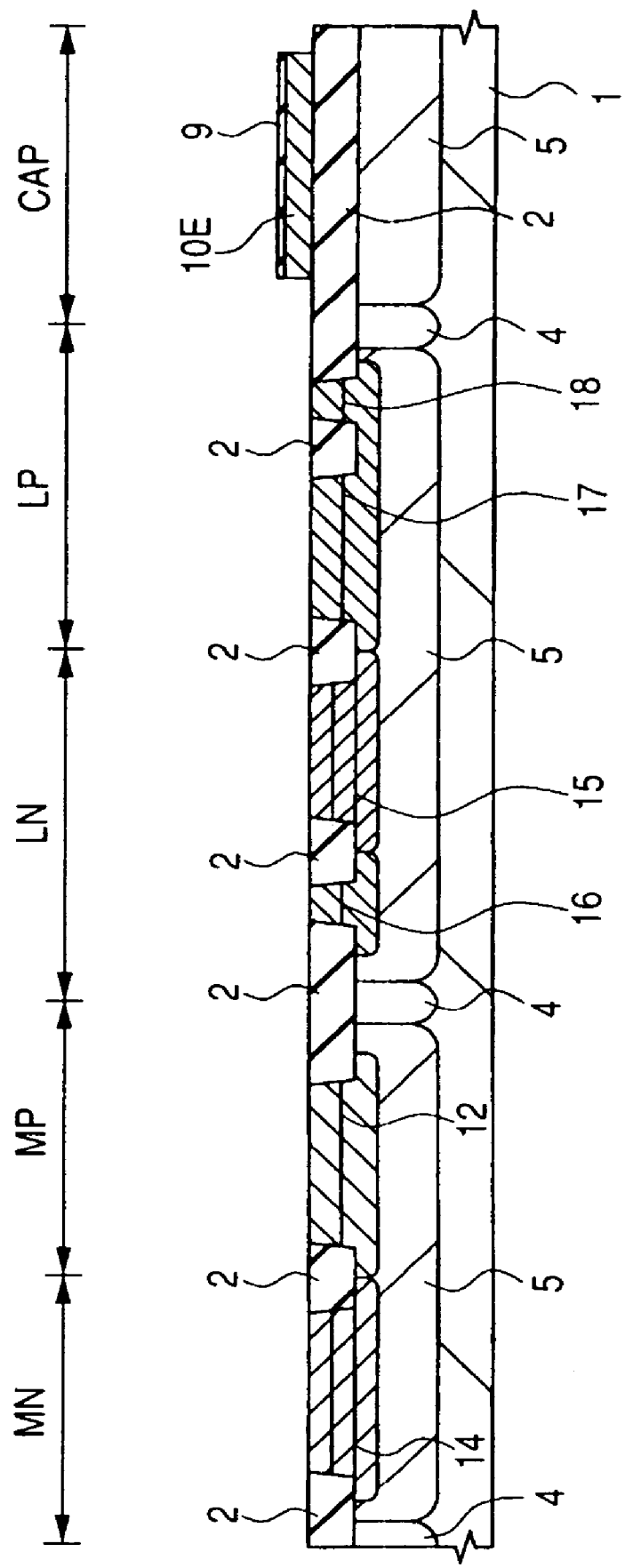
FIG. 9 is a sectional view of principal portions in a semiconductor integrated circuit device manufacturing step which follows FIG. 7.

Next, as shown in FIGS. 8 and 9, using a photoresist film as a mask, for example B ions are introduced into the substrate 1 to form in region LN a fifth p-type well 15 having an impurity which exhibits p-type conductivity and form in regions HN, OHN and LN a p-type semiconductor layer 16 having an impurity which exhibits p-type conductivity. Also at this time, as in the formation of the third p-type well 13 and fourth p-type well 14, the introduction of such ions as B or $BF_2$ ions into the substrate 1 is performed dividedly in plural times and the depth of ion introduction is controlled every time by changing the ion introducing energy each time.

Then, using a photoresist film as a mask, ions such as, for example, P or As ions, are introduced into the substrate 1 to form in LP region a fifth n-type well 17 having an impurity which exhibits n-type conductivity and form in HP, OHP and LP regions an n-type semiconductor layer 18 having an impurity which exhibits n-type conductivity. Also as this time, as in the formation of the third and fourth n-type wells 11, 12, the introduction of such ions as P or As ions into the substrate 1 is performed dividedly in plural times and the depth of ion introduction is controlled every time by changing the ion introducing energy each time.

Figure 10:
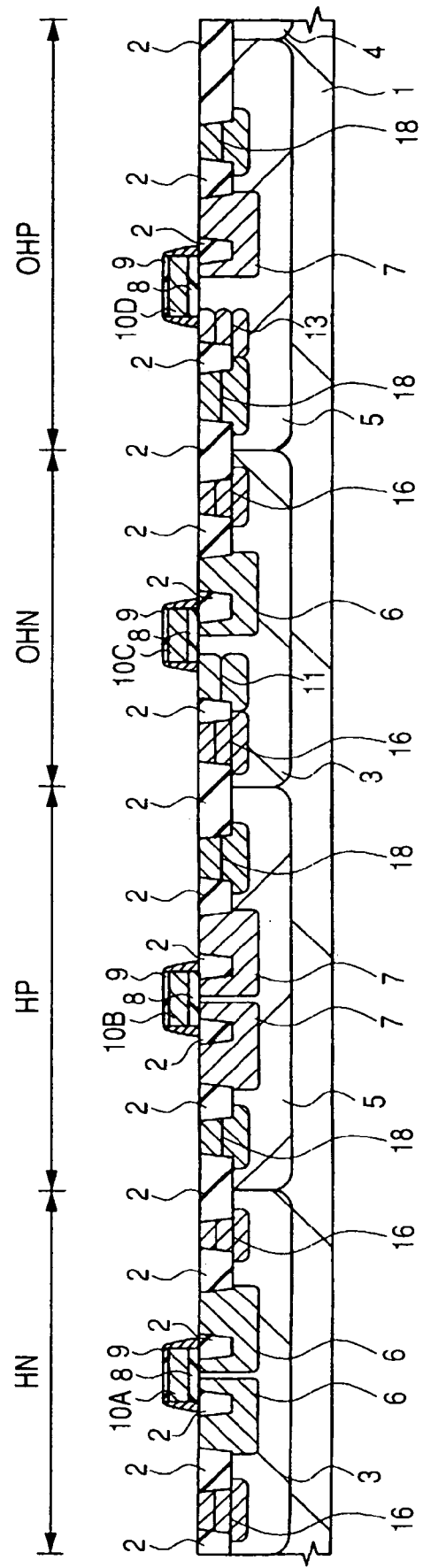
FIG. 10 is a sectional view of principal portions in a semiconductor integrated circuit device manufacturing step which follows FIG. 8.
Figure 11:
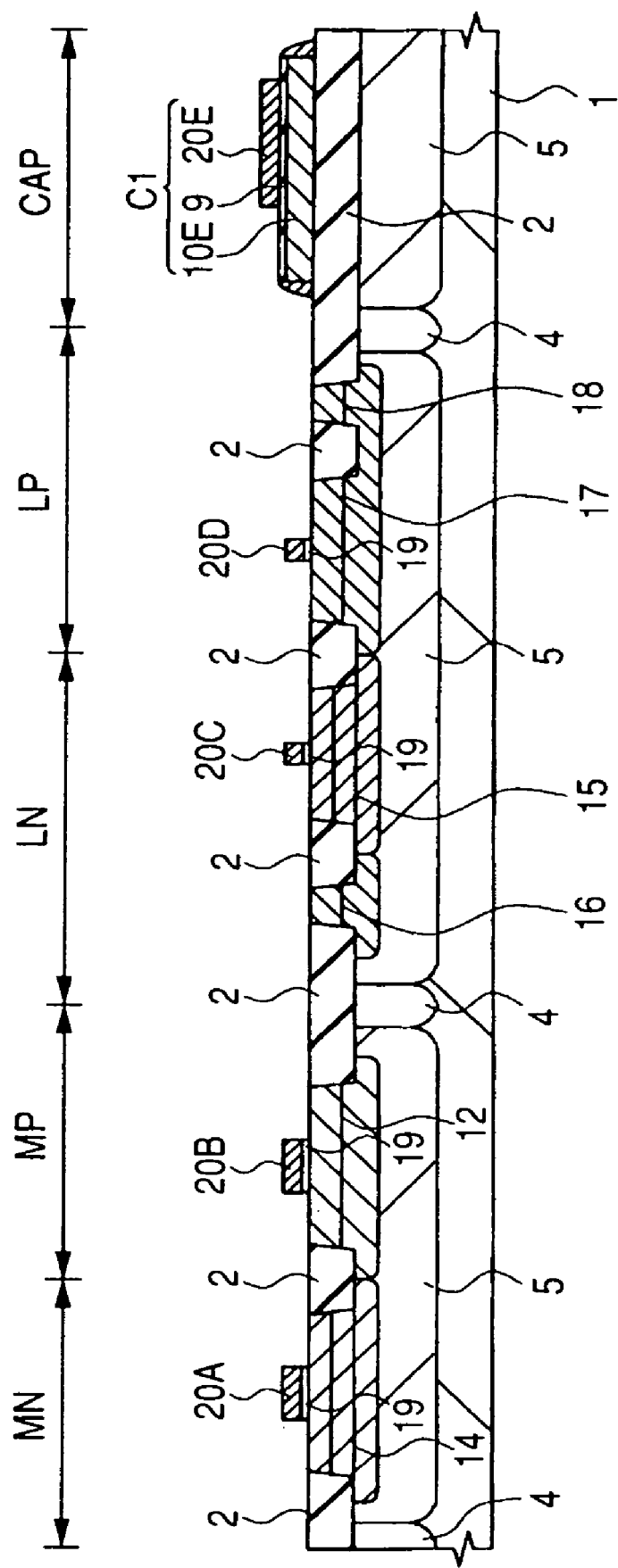
FIG. 11 is a sectional view of principal portions in a semiconductor integrated circuit device manufacturing step which follows FIG. 9.

Next, as shown in FIGS. 10 and 11, a thermal oxidation treatment is applied to the substrate 1 to form a gate insulating film 19 on the surface of the substrate 1. Subsequently, a polycrystalline silicon film (second conductive film) is deposited on the substrate 1, followed by patterning the polycrystalline silicon film by dry etching through a photoresist film as a mask to form a gate electrode 20A in MN region, a gate electrode 20B in MP region, a gate electrode 20C in LN region, a gate electrode 20D in LP region, and an upper electrode 20E as a capacitance element in CAP region. Through the steps so far described there is formed in CAP region a capacitance element C1 using the lower electrode 10E and the upper electrode 20E as capacitance electrodes and the insulating film 9 as a capacitance insulating film.

According to the above process, since the gate electrode of the high breakdown voltage MISFET, the gate electrode of MISFET with a high breakdown voltage drain and the lower electrode 10E of the capacitance element C1 are formed together in one and same step, it is possible to decrease the number of steps in comparison with patterning them separately.

Figure 12:
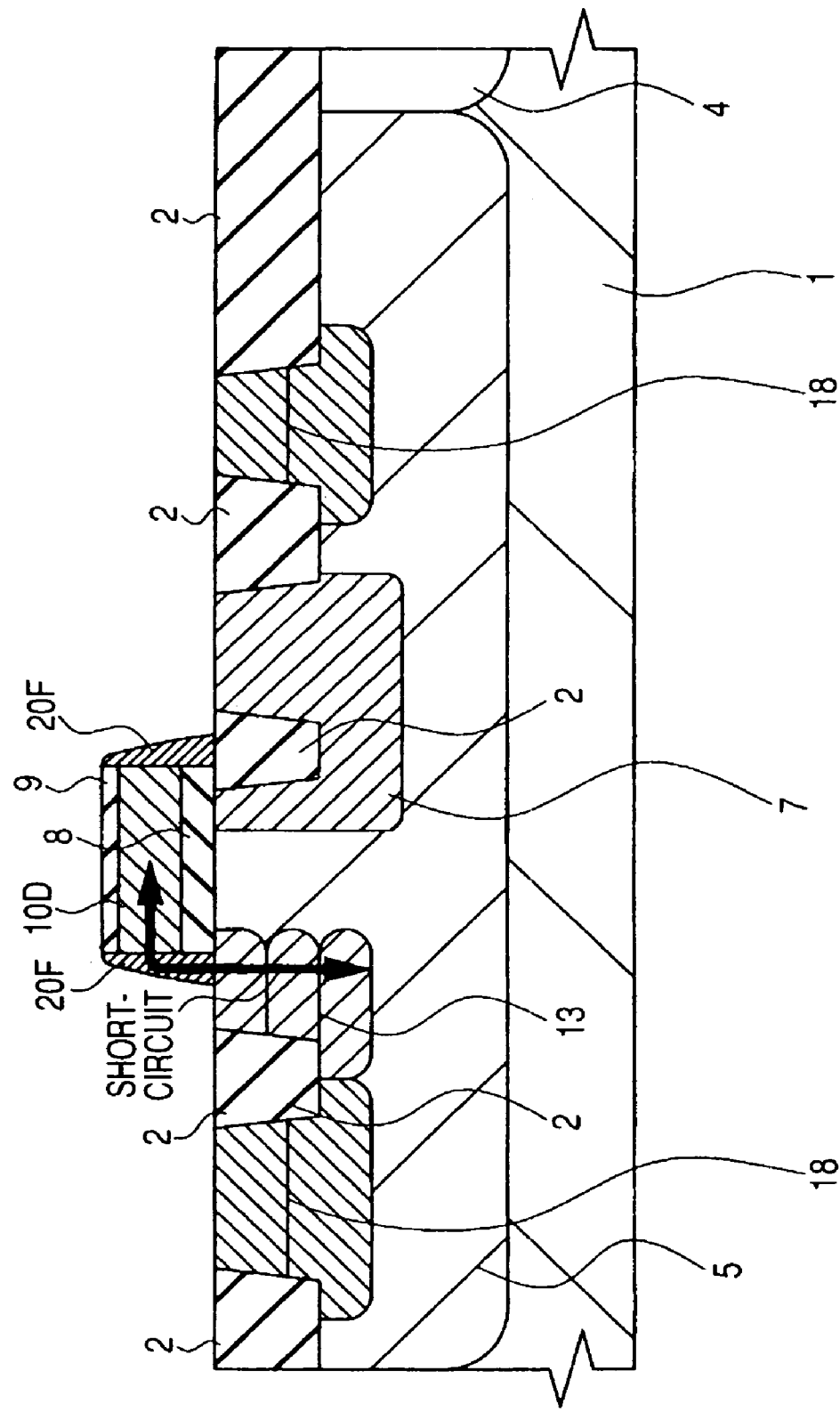
FIG. 12 is a sectional view showing on a larger scale a principal region included in FIG. 10.

However, in case of patterning the polycrystalline silicon film serving as the gate electrodes 20A to 20D, since the polycrystalline silicon film is etched anisotropically, the polycrystalline silicon film remains as side walls 20F on side walls of the gate electrode 10D, for example as shown in FIG. 12 which is an enlarged view of OHP region. In a later step, a p-type semiconductor region which serves as the source of the p-channel MISFET in OHP region is formed in the third p-type well 13, but there is a fear that this p-type semiconductor region and the gate electrode 10D may be shorted by the side walls 20F.

For avoiding the above-mentioned inconvenience, a description will be given below with reference to FIGS. 13 to 30 about a semiconductor integrated circuit device manufacturing method embodying the present invention.

Figure 13:
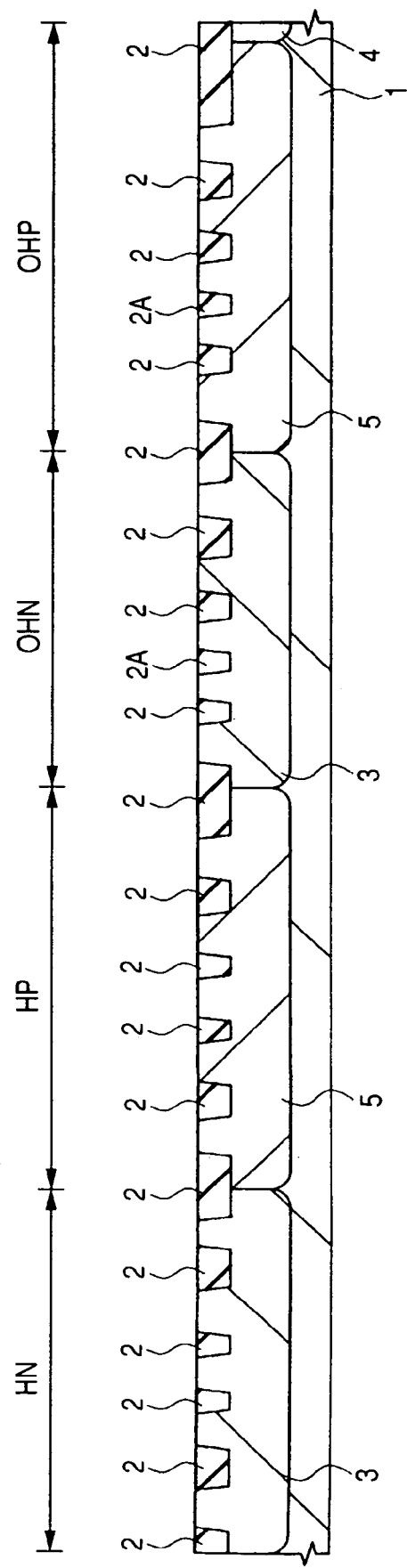
FIG. 13 is a sectional view of principal portions, illustrating a semiconductor integrated circuit device manufacturing method according to an embodiment of the present invention.

First, as shown in FIG. 13, an element isolation trench 2 is formed in a main surface of a substrate 1 in the same manner as in the step described above in connection with FIGS. 1 and 2. At this time, in OHN and OHP regions, an element isolation trench 2A is also formed in the substrate main surface. The role and detailed position of the element isolation trench 2A will be described in connection with later steps. Then, the foregoing first p-type well 3, p-type isolation region 4 and first n-type well 5 are formed.

Figure 14:
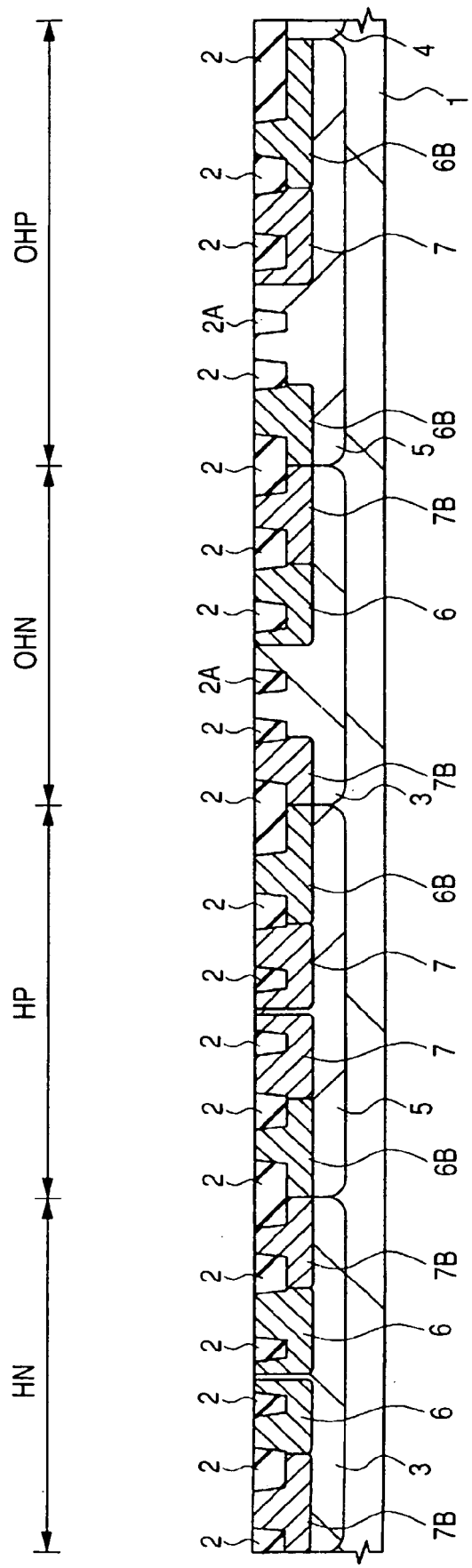
FIG. 14 is a sectional view of principal portions in a semiconductor integrated circuit device manufacturing step which follows FIG. 13.
Figure 15:
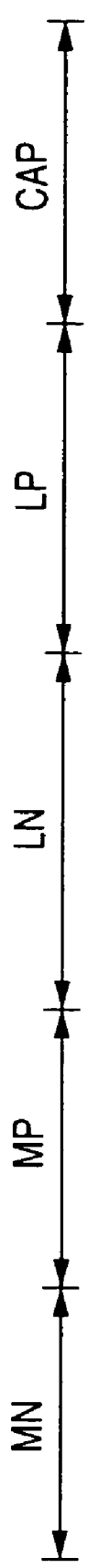
FIG. 15 is a sectional view of principal portions, illustrating the method embodying the present invention.
Figure 15:
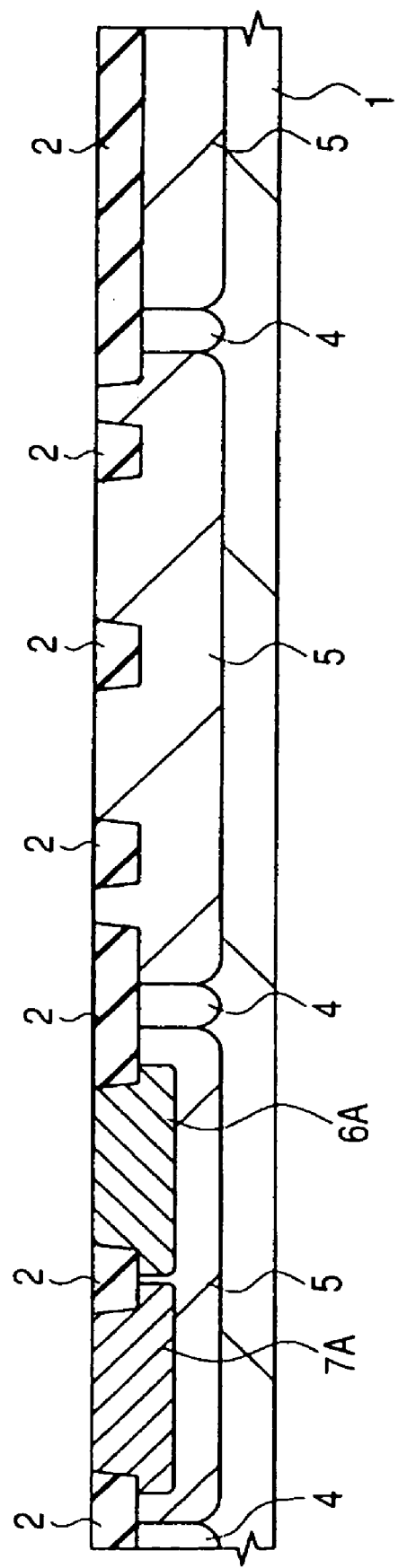

Next, as shown in FIGS. 14 and 15, ions such as P or As ions are introduced through a photoresist film as a mask into the substrate 1 with use of energy of about 360 keV, thereby forming a second n-type well (first semiconductor region) 6 in HN and OHN regions, also forming in MP region a fourth n-type well 6A having the same function as that of the fourth n-type well 12 shown in FIG. 8 and further forming in HP and OHP regions an n-type semiconductor layer 6B having the same function as that of the n-type semiconductor layer 18 shown in FIG. 8. Then, the photoresist film which has been used in forming the second n-type well 6, fourth n-type well 6A and n-type semiconductor layer 6B is removed and thereafter, using a photoresist film again as a mask, ions such as, for example, P or As ions are introduced into the substrate 1 with use of energy of about 200 kev, thereby forming in HP and OHP regions a second p-type well (first semiconductor region) 7 having an impurity which exhibits p-type conductivity, also forming in MN region a fourth p-type well 7A having the same function as that of the fourth p-type well 14 shown in FIG. 7 and further forming in HN and OHN regions a p-type semiconductor layer 7B having the same function as that of the p-type semiconductor layer 16 shown in FIG. 8. In the process described above in connection with FIGS. 1 to 12, the step of forming the second n-type well 6 (second p-type well 7) and the step of forming the fourth n-type well 6A and the n-type semiconductor layer 6B (fourth p-type well 7A and p-type semiconductor layer 7B) are separate steps, but by combining the two it is possible to decrease the number of steps for manufacturing the semiconductor integrated circuit device according to this embodiment. The depth of the second n-type well 6 and that of the fourth n-type well 6A are equal to each other. The depth of the second p-type well 7 and that of the fourth p-type well 7A are also equal to each other.

Figure 16:
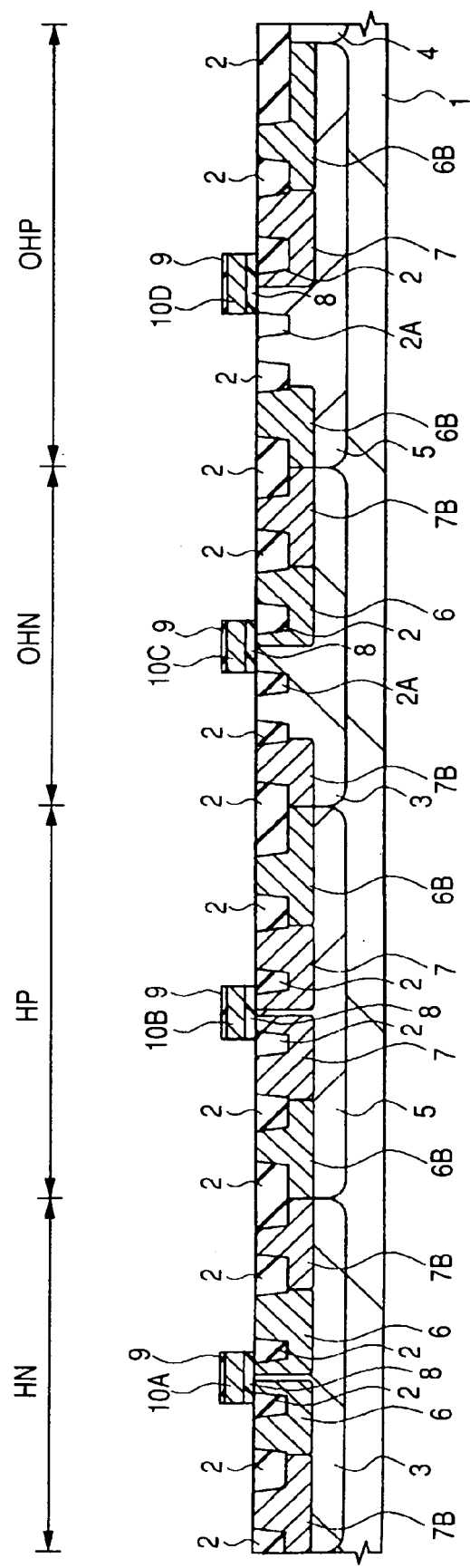
FIG. 16 is a sectional view of principal portions in a semiconductor integrated circuit device manufacturing step which follows FIG. 14.
Figure 17:
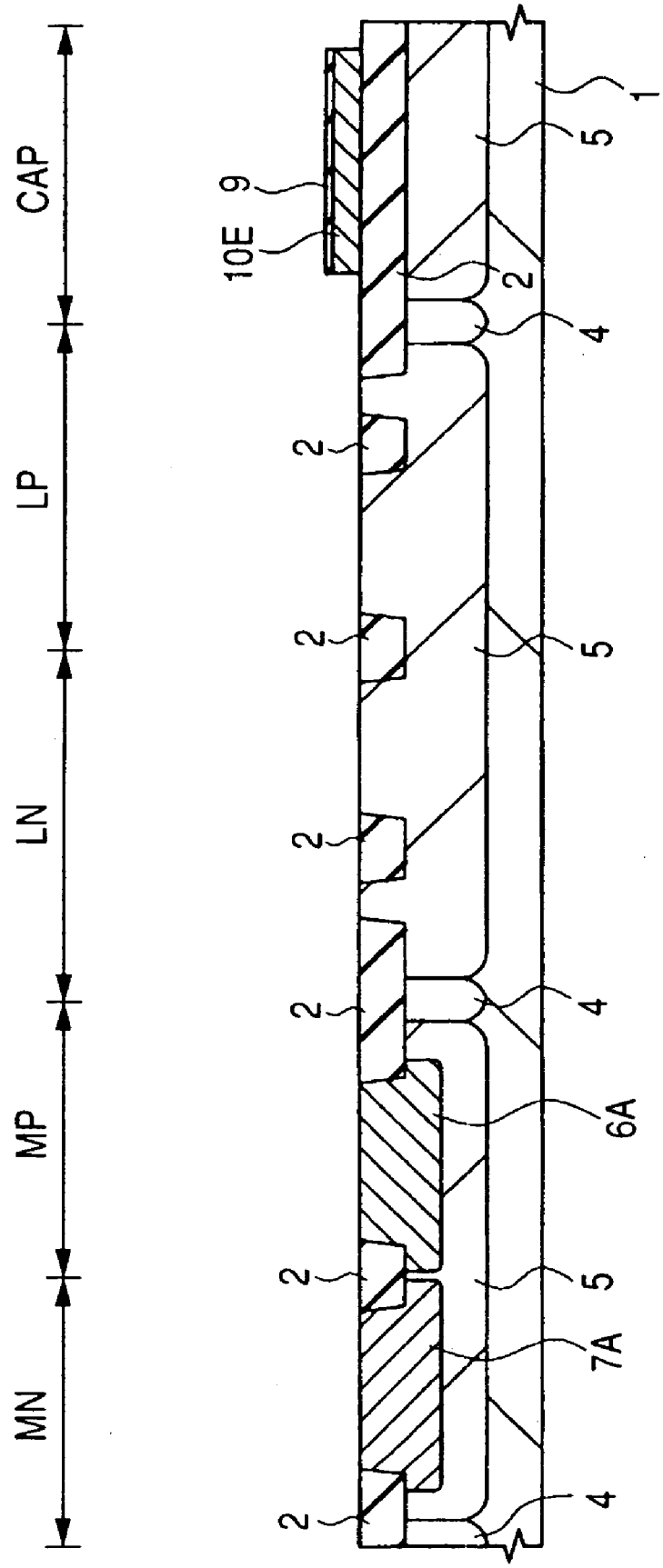
FIG. 17 is a sectional view of principal portions in a semiconductor integrated circuit device manufacturing step which follows FIG. 15.

Then, as shown in FIGS. 16 and 17, a gate insulating film 8, gate electrodes 10A, 10B, 10C, 10D, a lower electrode 10E as a capacitance element and an insulating film 9 are formed by the same step as that described above in connection with FIGS. 4 and 5. At this time, end portions in the gate length direction of the gate electrodes 10A, 10B, 10C and 10D of MISFETS in HN, HP, OHN and OHP regions are formed so as to be disposed on element isolation trenches 2. That is, the illustrated structure includes element isolation trenches 2 within the source and drain regions of MISFETs in OHN and OHP regions which are formed in a later step. The reason is the same as that explained earlier in connection with FIGS. 1 to 12. In the MISFETs of regions OHN and OHP shown in FIGS. 1 to 12, no element isolation trench 2 is formed within the source region, while in this embodiment an element isolation trench 2 (element isolation trench 2A to be described later) is formed also within the source region. This is because it is intended to solve the problem referred to above in connection with FIG. 12. In the MISFETs of OHN and OHP regions in this embodiment, the width of the element isolation trench 2A formed in the source region is smaller than that of the element isolation trench 2 formed in the drain region. In this case, the element isolation trenches 2 formed in the source and drain regions of MISFETs in HN and HP regions are of the same size as the width of each of the element isolation trenches formed in the drain regions of MISFETs in OHN and OHP regions Therefore, by thus forming the element isolation trench 2A in the source region it is possible to solve the foregoing problem of short-circuit and reduce the MISFET size as much as possible. That is, it is possible to not only improve the production yield of the semiconductor integrated circuit device but also promote the microfabrication thereof.

Figure 18:
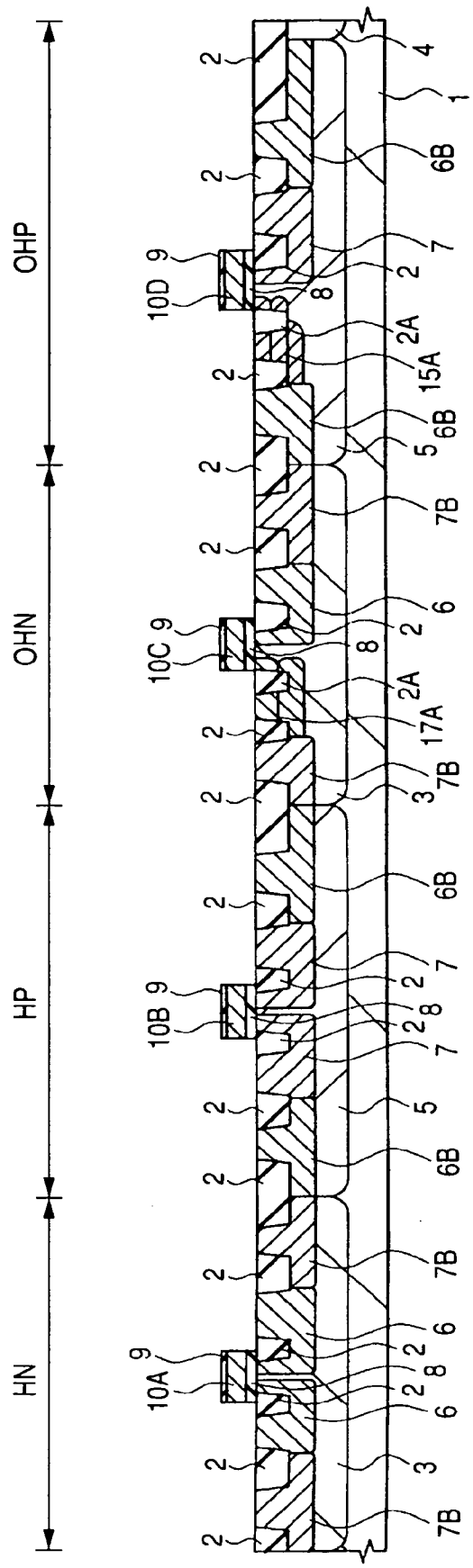
FIG. 18 is a sectional view of principal portions in a semiconductor integrated circuit device manufacturing step which follows FIG. 16.
Figure 19:
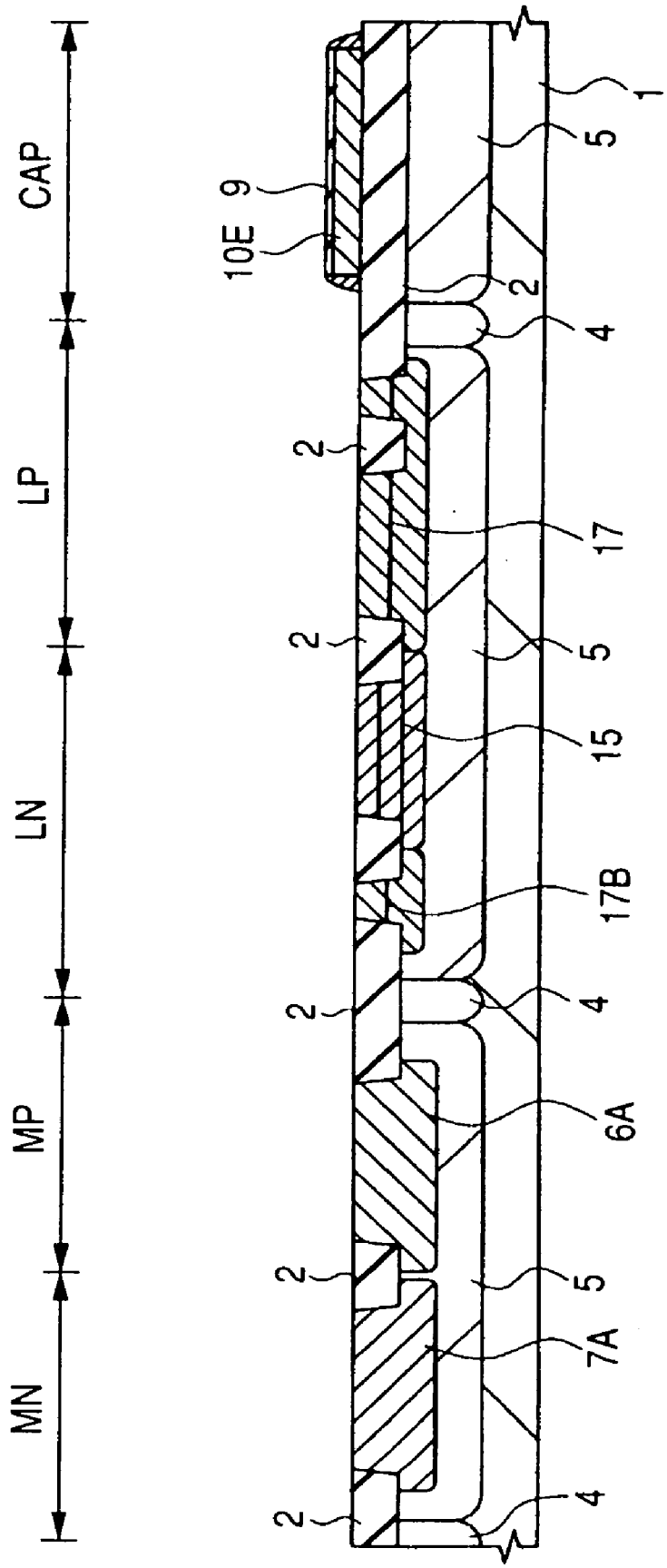
FIG. 19 is a sectional view of principal portions in a semiconductor integrated circuit device manufacturing step which follows FIG. 17.

Next, as shown in FIGS. 18 and 19, a fifth p-type well (first well region) 15 is formed in LN region by the same step as that described above in connection with FIGS. 8 and 9. At this time, in OPH region there is formed a p-type semiconductor layer 15A as a source of the p-type MISFET. That is, the p-type semiconductor layer 15A is formed in the same step as that of forming the fifth p-type well 15 in LN region. The depth of the p-type semiconductor layer 15A and that of the fifth p-type well 15 are equal to each other. This is also the case with an n-type semiconductor layer 17 in LP region and an n-type semiconductor layer 17A serving as a source in OHN region both of which will be described later.

The fifth p-type well 15 and the p-type semiconductor layer 15A are each composed of three different layers of wells. The three layers of wells are formed so that their concentrations become higher in the order of first layer (a layer close to the substrate), third layer (a layer lying in the deepest position from the substrate surface) and second layer (a layer between the first and third layers) in the depth direction from the substrate surface.

The first-layer well is formed mainly for adjusting the threshold value of the MISFET in region LN and it is formed by the implantation of ions such as $BF_2$ ions. As to the depth of the first-layer well, the same well is formed at a position shallower than the element isolation trench 2 (2A).

The third-layer well is formed at a position deeper than the element isolation trench 2 (2A) and it is formed by the implantation of ions such as B ions. The reason why the third-layer well is made high in concentration is that it is intended to decrease the parasitic capacitance between the gate electrode 20 formed on the element isolation trench 2 and the substrate. That is, if the third-layer well is formed so as to be lower in impurity concentration than the second-layer well, the aforesaid parasitic capacitance increases, with a consequent likelihood of occurrence of leakage current.

An n-type semiconductor layer 17 in LP region and an n-type semiconductor layer 17A serving as a source in OHN region, both of which will be described later, are also formed for the same purpose as that just mentioned above.

Figure 20:
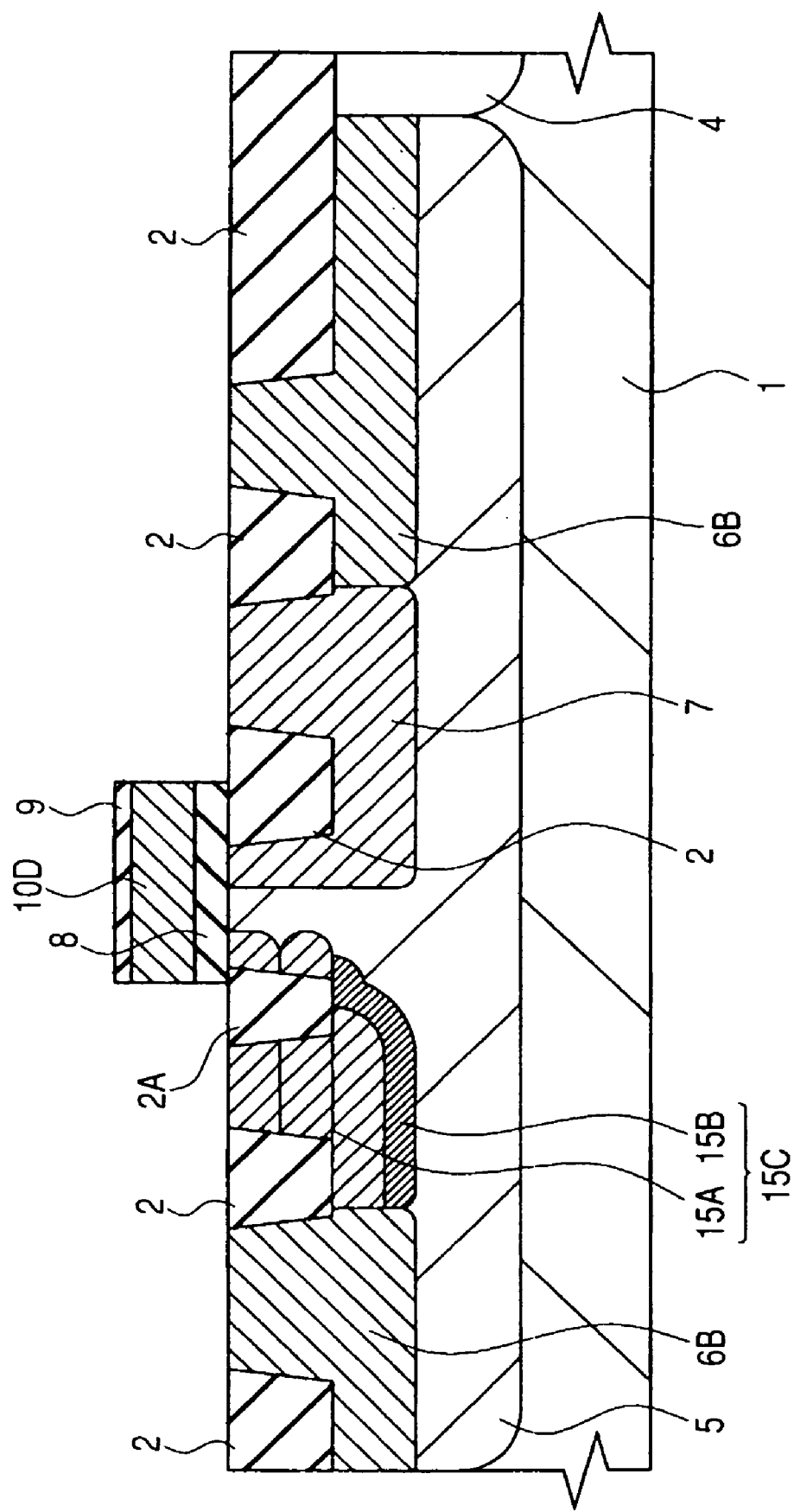
FIG. 20 is a sectional view showing on a larger scale a principal region included in FIG. 18.

As shown in FIG. 20, which is an enlarged view of OHP region, ions such as, for example, B or $BF_2$ ions are introduced into the substrate 1 using as a mask the photoresist film which has been used in forming the p-type semiconductor layer 15A, thereby forming under the p-type semiconductor layer 15A a p-type semiconductor layer 15B which exhibits p-type conductivity. From the p-type semiconductor layers 15A and 15B there is formed a third p-type well (second semiconductor region) 15C having the same function as that of the third p-type well 13 which has been described above in connection with FIG. 6. It is necessary that the third p-type well 15C be formed deeper than the element isolation trench 2A, but an attempt is made to form the third p-type well 15C from only the p-type semiconductor layer 15A, there is a fear that the third p-type well 15C may not be formed deeper than the element isolation trench 2A. In view of this point, by introducing ions such as B or $BF_2$ ions into the substrate 1 with use of energy larger than the energy used in forming the p-type semiconductor layer 15A to form the p-type semiconductor layer 15B, it becomes possible to form the third p-type well 15C deeper than the element isolation trench 2A.

Next, a fifth n-type well (first well region) 17 is formed in LP region by the same step as that described above in connection with FIGS. 8 and 9. At this time, in OHN region there is formed a third n-type well 17A having the same function as that of the third n-type well 11 shown in FIG. 8 (see FIGS. 18 and 19). Also at this time, in the same manner as in the formation of the fifth p-type well in LN region, ions such as P or As ions are introduced into the substrate 1 using as a mask the photoresist film used in forming the n-type semiconductor layer 17A and with energy larger than that used in forming the n-type semiconductor layer 17A, thereby forming under the n-type semiconductor layer 17A an n-type semiconductor layer 17B having an impurity which exhibits n-type conductivity.

Figure 21:
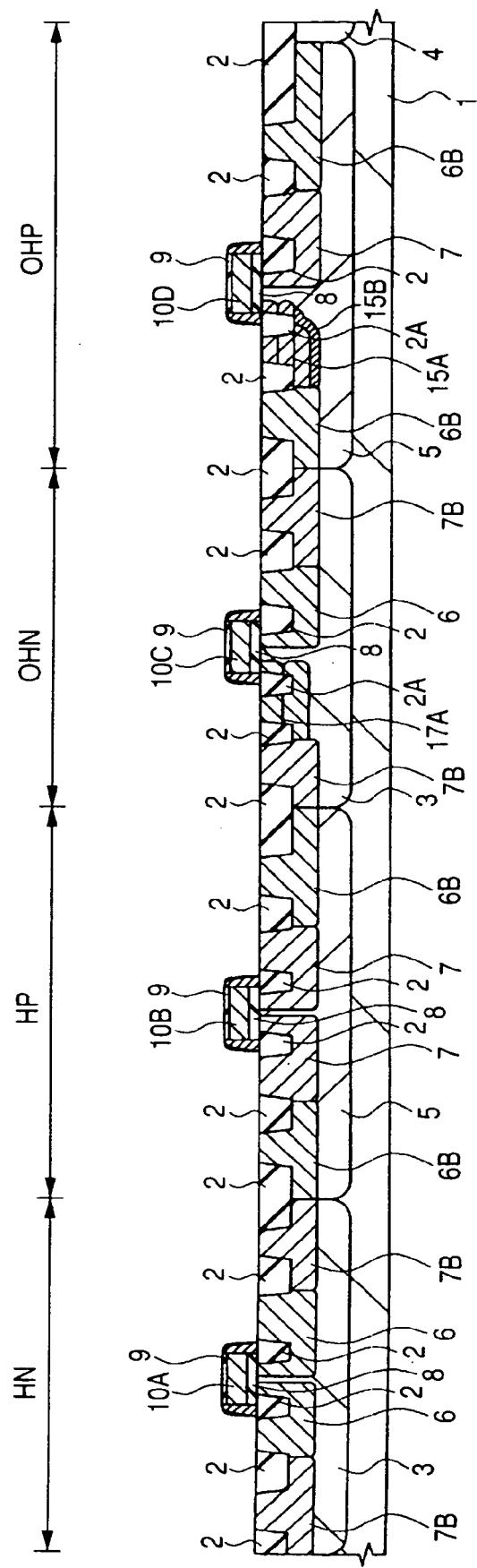
FIG. 21 is a sectional view of principal portions in a semiconductor integrated circuit device manufacturing step which follows FIG. 18.
Figure 22:
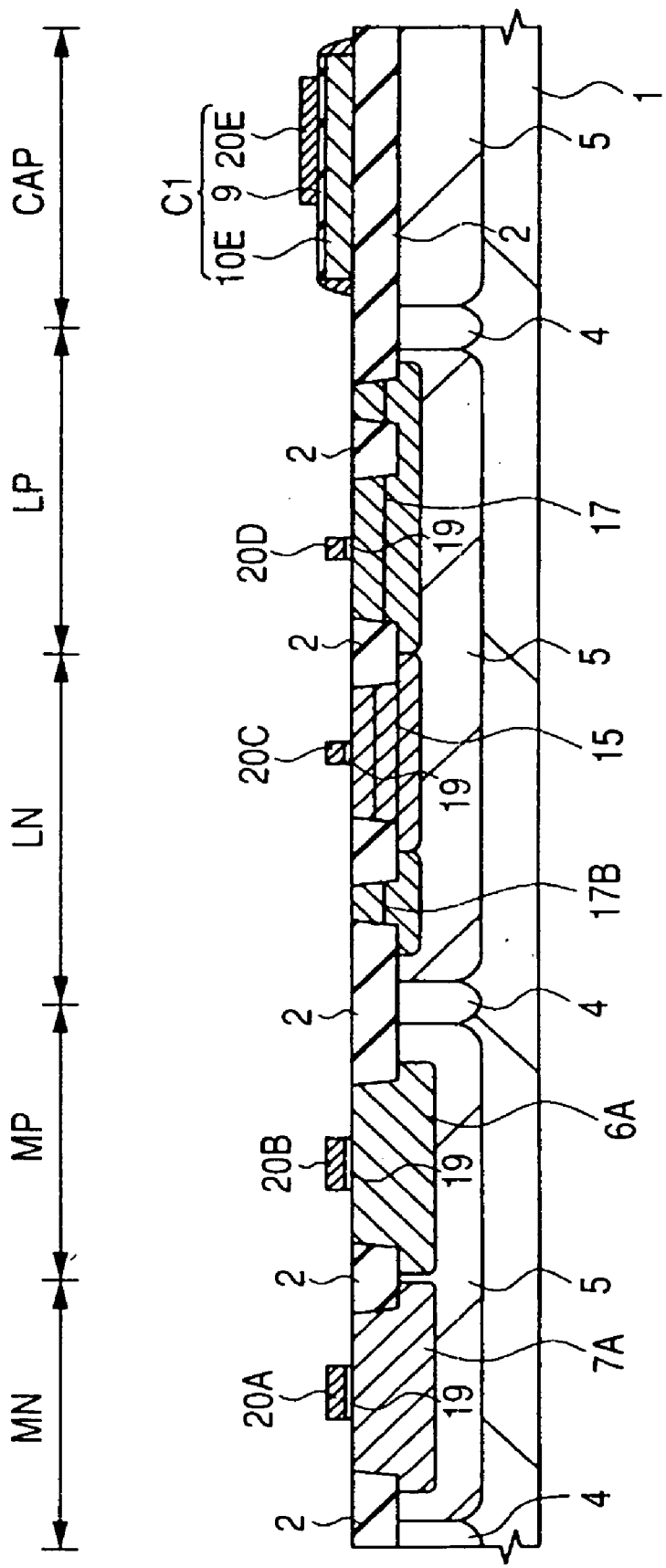
FIG. 22 is a sectional view of principal portions in a semiconductor integrated circuit device manufacturing step which follows FIG. 19.

Then, as shown in FIGS. 21 and 22, a gate insulating film (second gate insulating film) 19, gate electrodes (second gate electrodes) 20A, 20B, 20C, 20D and an upper electrode 20E as a capacitance element are formed by the same step as that described above in connection with FIGS. 10 and 11. By the steps so far described it is possible to form a capacitance element C1 using the lower electrode 10E and the upper electrode 20E as capacitance electrodes and the insulating film 9 as a capacitance insulating film. As to the length in the gate length direction of each of the gate electrodes 10 and 20, these gate electrodes are formed so that the gate electrodes 10A to 10D are the longest, the gate electrodes 20A and 20B are the next longest and the gate electrodes 20C and 20D are the shortest.

Figure 23:
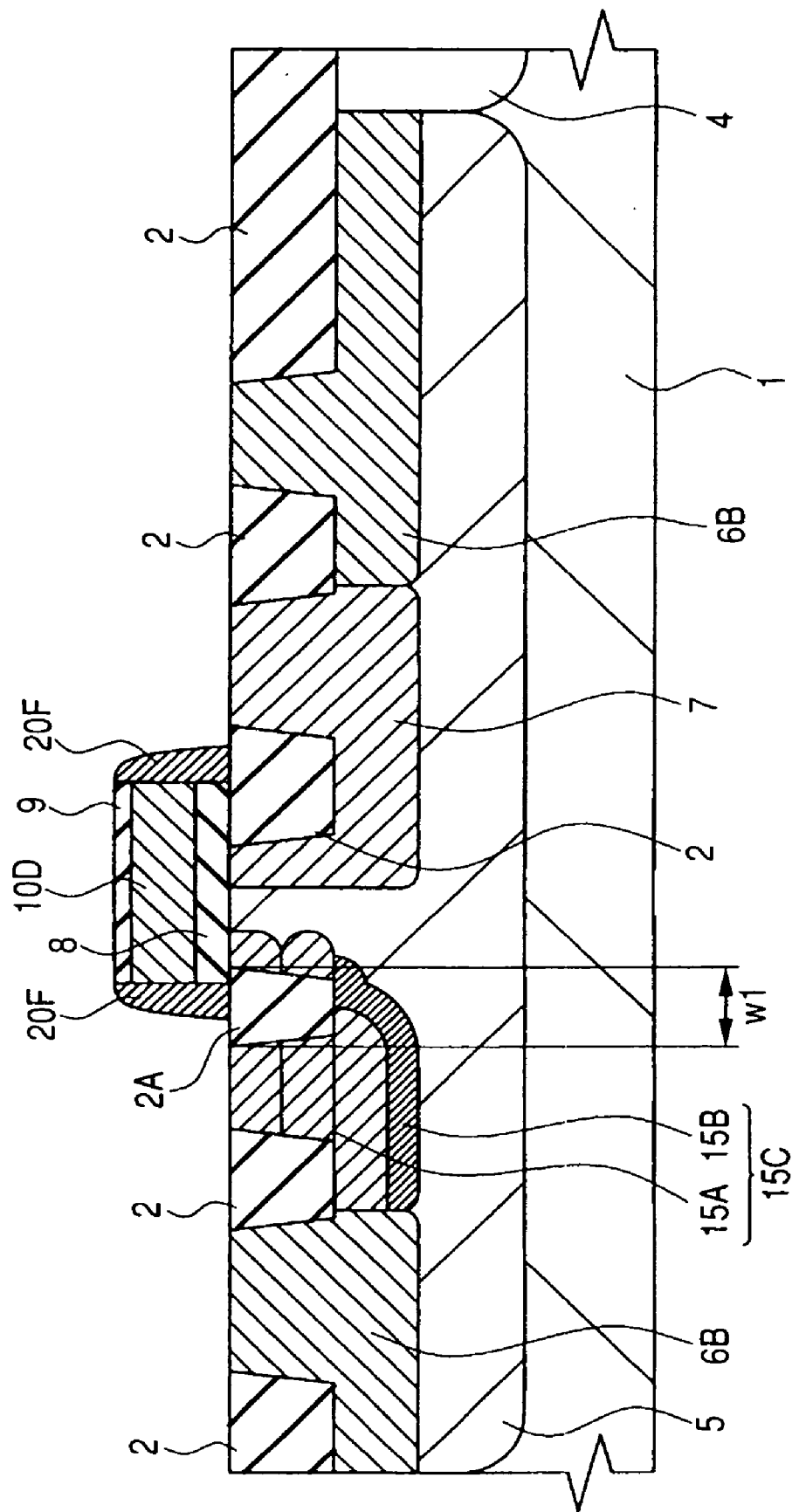
FIG. 23 is a sectional view showing on a larger scale a principal region-included in FIG. 21.

In this embodiment, as shown in FIG. 23 which is an enlarged view of OHP region, the width w1 of the element isolation region 2A under a side wall of the gate electrode 10D is set larger than the sum of the thickness (t1) of the polycrystalline silicon film serving as the gate electrodes 20A, 20B, 20C, 20D and the upper electrode 20E as a capacitance element, the thickness (t2) of the gate insulating film and an alignment allowance (t3) in processing for the gate electrode 10D, in a direction orthogonal to the extending direction of the gate electrode 10D, i.e., in the gate length direction (first direction). The element isolation trench 2A is formed in advance so as not to become larger than the thickness (t1) of the polycrystalline silicon film in a planar region not overlapping the gate electrode 10D. As a result, it becomes possible for the side walls 20F to remain on only the element isolation trench 2A and hence the p-type semiconductor region serving as the source of the p-channel MISFET with a high breakdown voltage drain and the gate electrode 10D can be prevented from being shorted by the side walls 20F.

Figure 24:
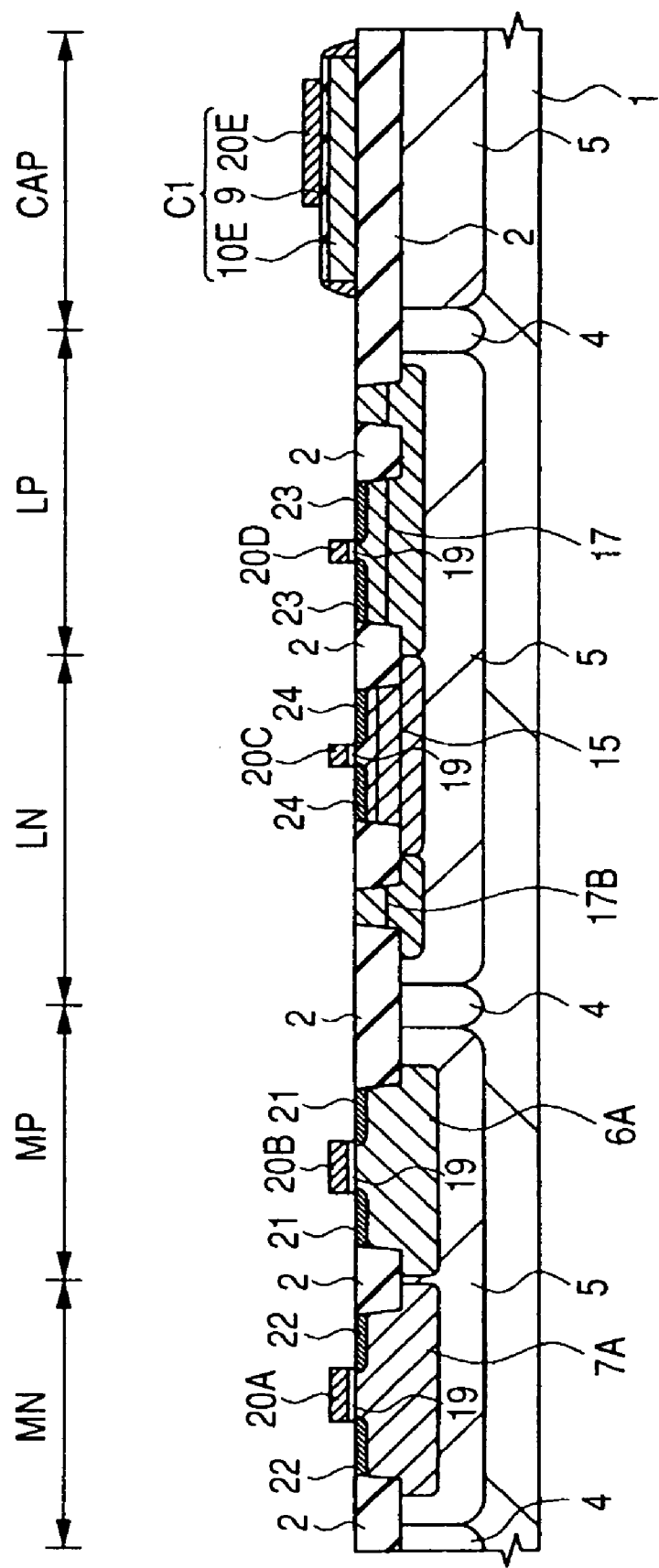
FIG. 24 is a sectional view of principal portions in a semiconductor integrated circuit device manufacturing step which follows FIG. 22.

Next, as shown in FIG. 24, ions such as B or $BF_2$ ions are introduced in MP region using a photoresist film as a mask to form a $p^-$-type semiconductor region 21 having an impurity which exhibits p-type conductivity. Then, the photoresist film which has been used in forming the $p^-$-type semiconductor region 21 is removed and thereafter ions such as P or As ions are introduced into MN region using a photoresist film again as a mask to form an $n^-$-type semiconductor region 22 having an impurity which exhibits n-type conductivity.

Subsequently, ions such as B or $BF_2$ ions are introduced into LP region using a photoresist film as a mask to form a $p^-$-type semiconductor region (third semiconductor region) 23 having an impurity which exhibits p-type conductivity. Then, the photoresist film which has been used in forming the $p^-$-type semiconductor region 23 is removed and thereafter ions such as P or As ions are introduced into LN region using a photoresist film again as a mask to form an $n^-$-type semiconductor region (third semiconductor region) 24 having an impurity which exhibits n-type conductivity.

Figure 25:
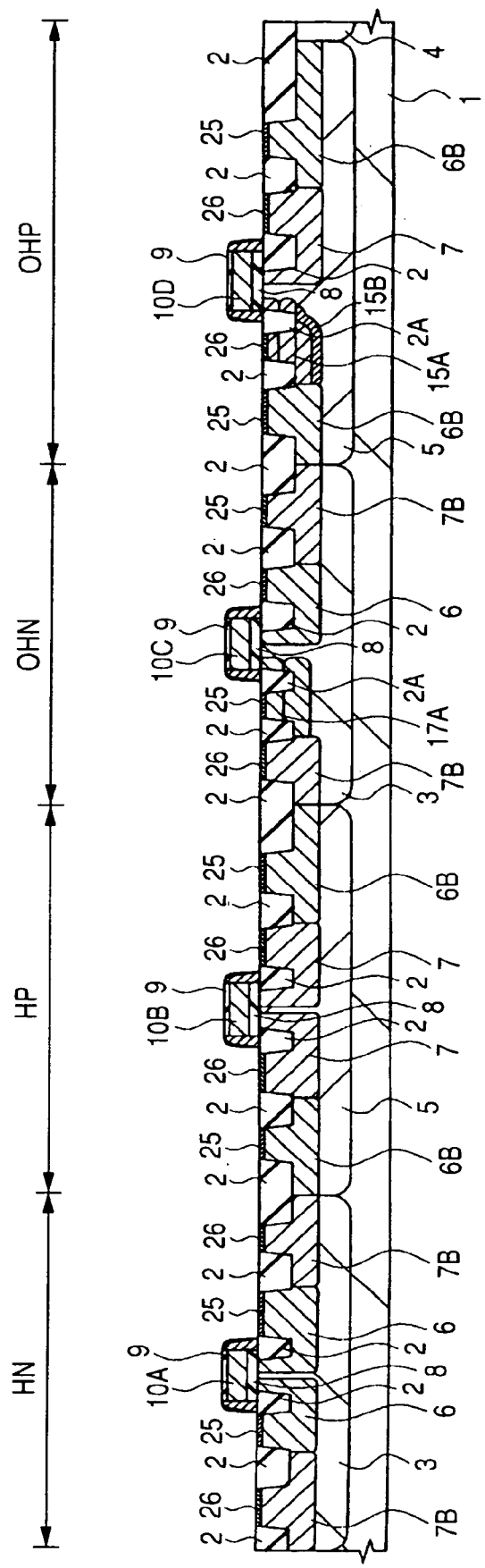
FIG. 25 is a sectional view of principal portions, illustrating the method embodying the present invention.
Figure 26:
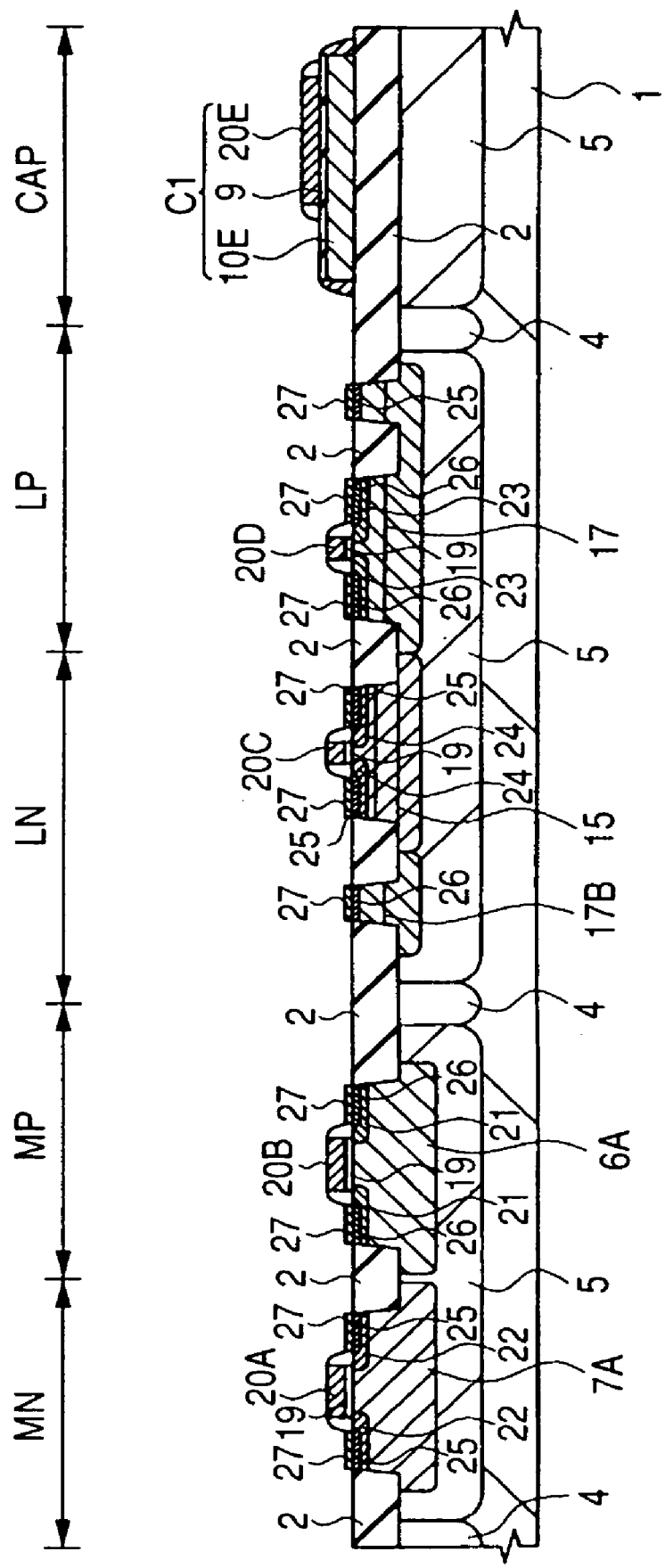
FIG. 26 is a sectional view of principal portions in a semiconductor integrated circuit device manufacturing step which follows FIG. 24.

Next, as shown in FIGS. 25 and 26, a silicon oxide film is deposited on the substrate 1 and is then etched anisotropically to form side wall spacers on side walls of the gate electrodes 20A, 20B, 20C and 20D. Then, ions such as P or As ions are introduced into the substrate 1 using a photoresist film as a mask to form an $n^+$-type semiconductor region (third semiconductor region) 25 having an impurity which exhibits n-type conductivity. Subsequently, the photoresist film which has been used in forming the $n^+$-type semiconductor region 25 is removed and thereafter ions such as B or $BF_2$ ions are introduced into the substrate 1 using a photoresist film again as a mask to form a $p^+$-type semiconductor region (third semiconductor region) 26 having an impurity which exhibits p-type conductivity. By the steps so far described, a high breakdown voltage n-channel MISFET using the $n^+$-type semiconductor region 25 and the third n-type well 17A as its source or drain is formed in HN region, a high breakdown voltage p-channel MISFET using the $p^+$-type semiconductor region 26 and the second p-type well 7 as its source or drain is formed in HP region, an high breakdown voltage n-channel MISFET using the $n^+$-type semiconductor region 25 and the third n-type well 17A and n-type semiconductor layer 17B as its source and the $n^+$-type semiconductor region 25 and the second n-type well 6 as its drain is formed in OHN region, a high breakdown voltage p-channel MISFET using the $p^+$-type semiconductor region 26, p-type well 15A and p-type semiconductor layer 15B as its source and the $p^+$-type semiconductor region 26 and second p-type well 7 as its drain is formed in OHP region, a medium breakdown voltage (about 6V) n-channel MISFET using the $n^+$-type semiconductor region 25 and the $n^-$-type semiconductor region 22 as its source or drain is formed in MN region, a medium breakdown voltage p-channel MISFET using the $p^+$-type semiconductor region 26 and the $p^-$-type semiconductor region 21 as its source or drain is formed in MP region, a low breakdown voltage (about 1.5V) n-channel MISFET using the $n^+$-type semiconductor region 25 and the $n^-$-type semiconductor region 24 as its source or drain is formed in LN region, and a low breakdown voltage p-channel MISFET using the $p^+$-type semiconductor region 26 and the $p^-$-type semiconductor region 23 as its source or drain is formed in LP region.

Figure 27:
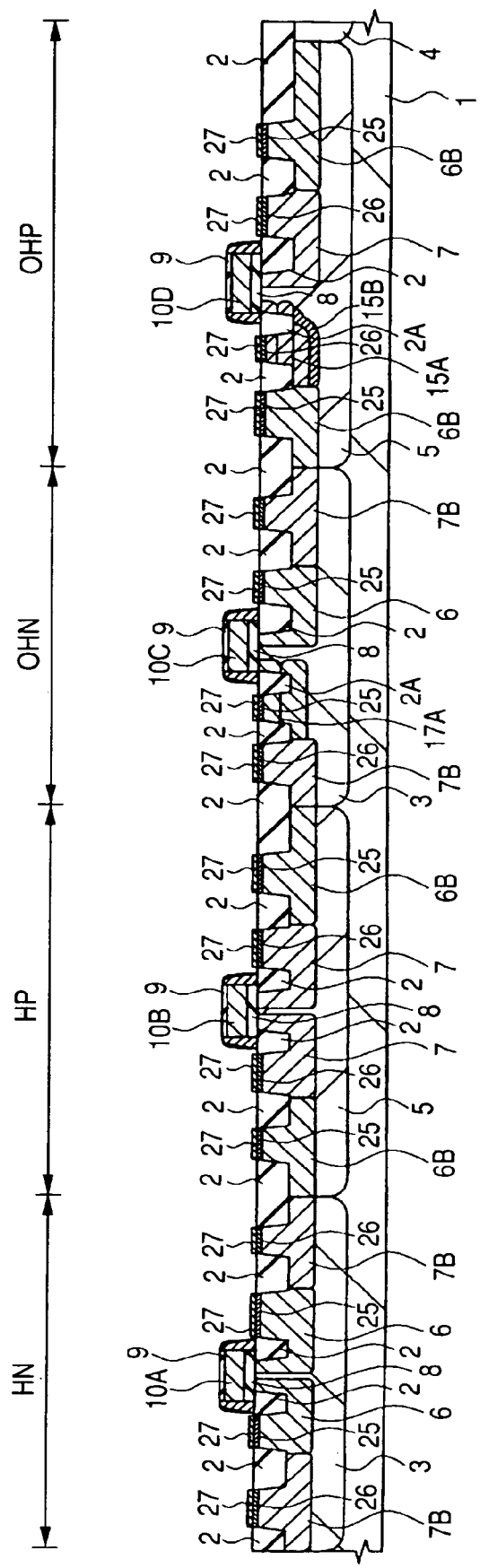
FIG. 27 is a sectional view of principal portions in a semiconductor integrated circuit device manufacturing step which follows FIG. 25.
Figure 28:
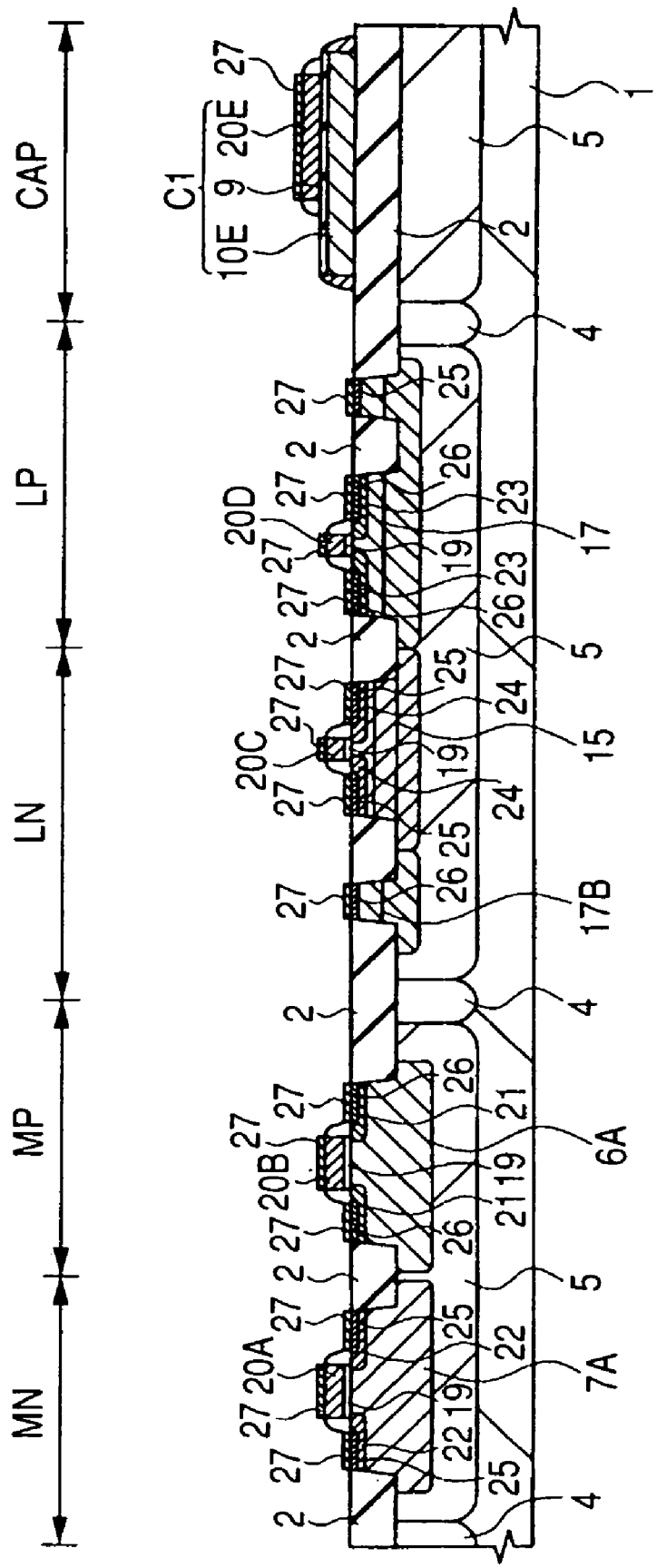
FIG. 28 is a sectional view of principal portions in a semiconductor integrated circuit device manufacturing step which follows FIG. 26.

Next, as shown in FIGS. 27 and 28, a Co (cobalt) film as a metal film is deposited on the substrate 1. Then, the Co film and Si (silicon) are reacted with each other by heat-treating the substrate 1 to form a $CoSi_2$ film 27 as a silicide film on the surfaces of the gate electrodes 20A, 20B, 20C, 20D, upper electrode 20E, $n^+$-type semiconductor region 25 and $p^+$-type semiconductor region 26. With the silicide film, it is possible to decrease the contact resistance of each gate electrode surface and semiconductor region surface. The $CoSi_2$ using Co is illustrated as the silicide film in this embodiment. However, even with use of another material, e.g., Ni (nickel) or Mo (molybdenum), there can be obtained the same effect.

In this way there are completed MISFETS in the various regions. As to the MISFETS in OHN and OHP regions, the structures of their source and drain regions are different. More specifically, although the element isolation trenches 2A are formed in the source and drain regions, they are different in size between the source and drain regions. The reason and effect thereof are as set forth above.

Moreover, the semiconductor layer which constitutes the source region is formed separately from the semiconductor layer which constitutes the drain region. In other words, the source and drain regions are formed so as to be asymmetric to each other and different in concentration distribution. The reason and effect thereof are set forth above.

Figure 29:
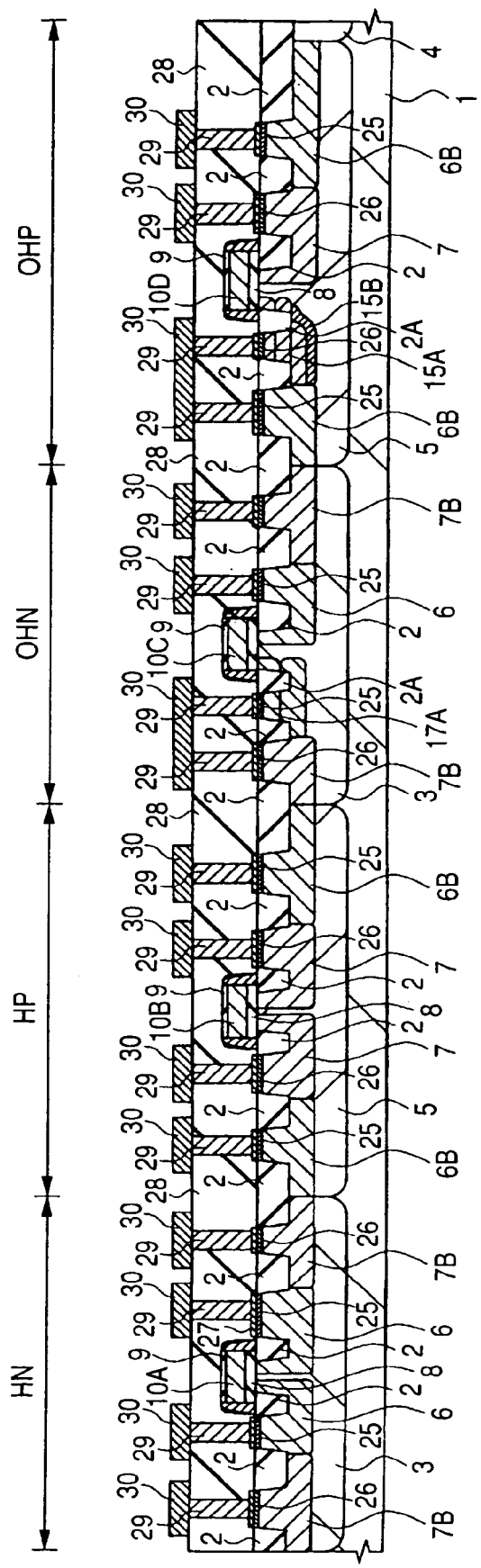
FIG. 29 is a sectional view of principal portions in a semiconductor integrated circuit device manufacturing step which follows FIG. 27.
Figure 30:
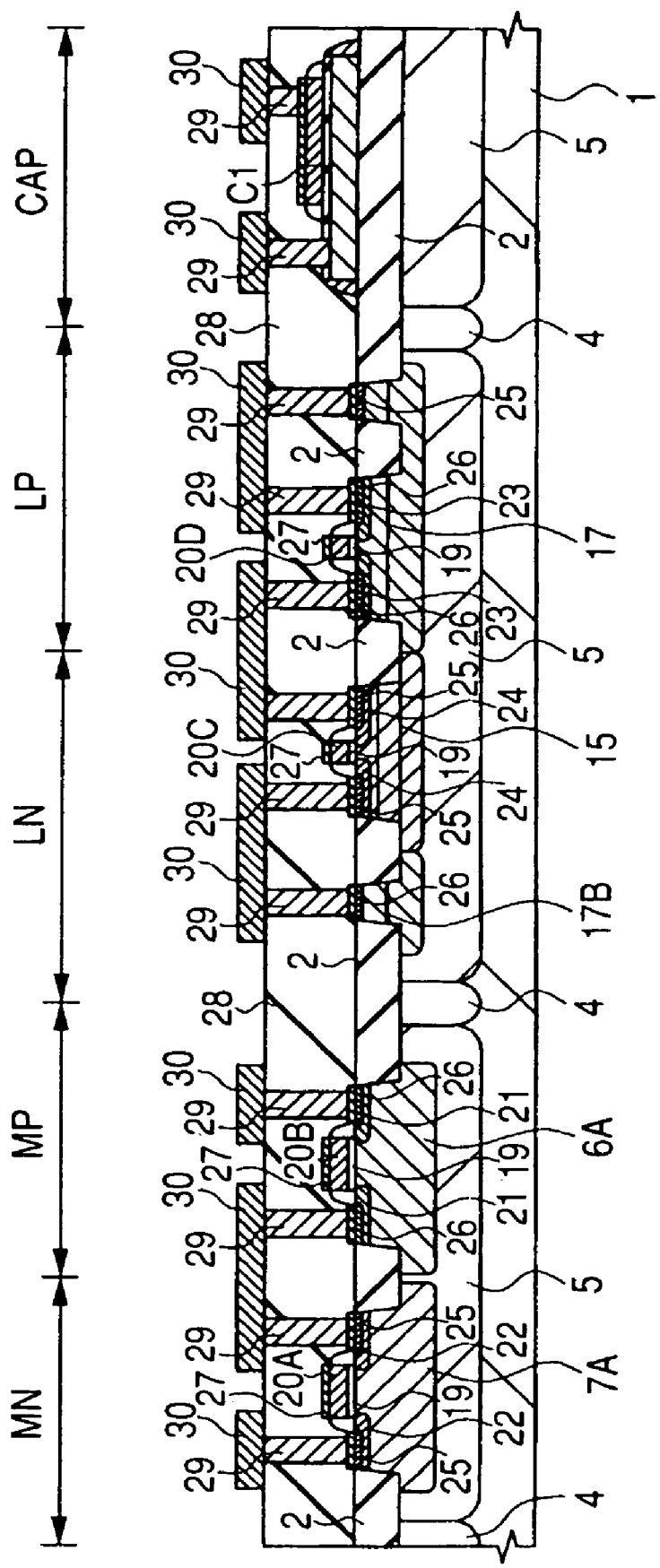
FIG. 30 is a sectional view of principal portions in a semiconductor integrated circuit device manufacturing step which follows FIG. 28.
Figure 31:
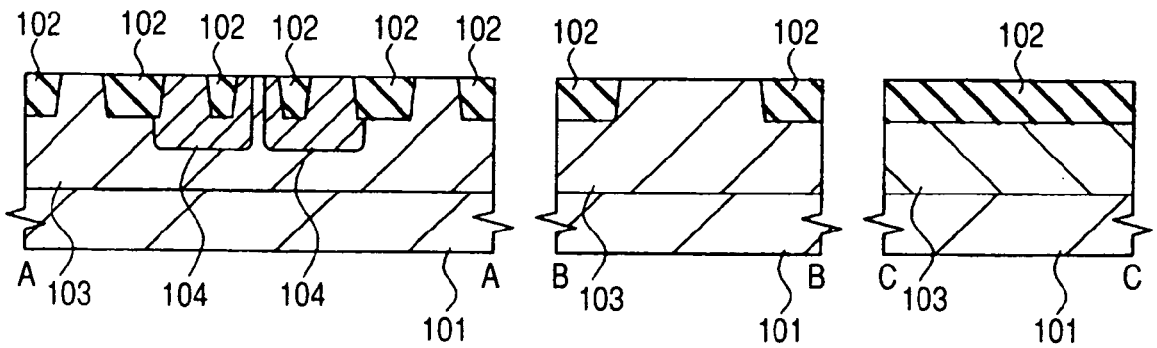
FIG. 31 is a sectional view of principal portions, illustrating a process for forming both a high breakdown voltage MISFET and a low breakdown voltage MISFET on the same substrate which the present inventors have studied.
Figure 32:
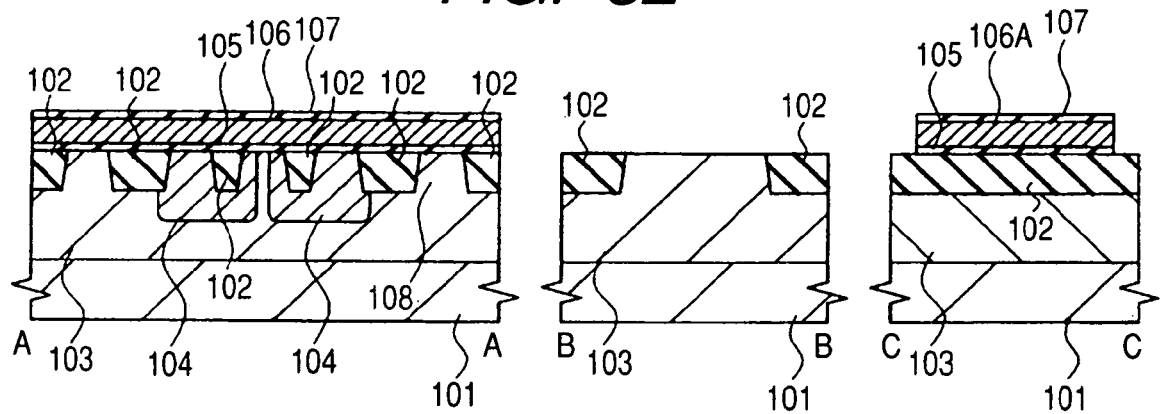
FIG. 32 is a sectional view of principal portions, illustrating the aforesaid process and following FIG. 31.
Figure 33:
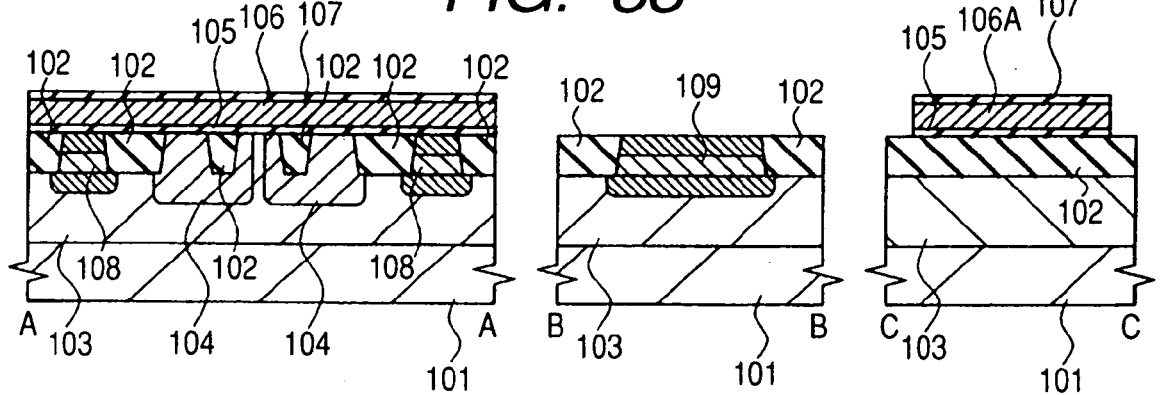
FIG. 33 is a sectional view of principal portions, illustrating the aforesaid process and following FIG. 32.
Figure 34:
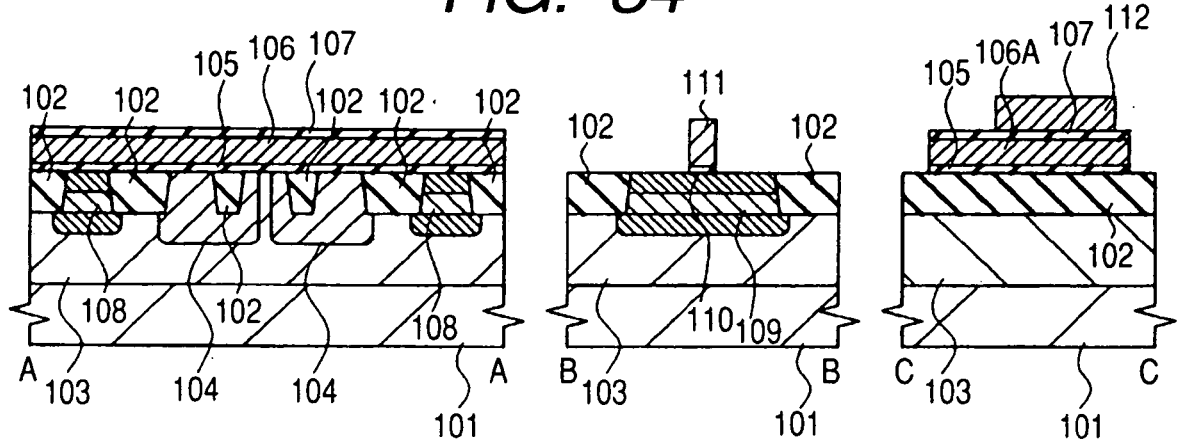
FIG. 34 is a sectional view of principal portions, illustrating the aforesaid process and following FIG. 33.
Figure 35:
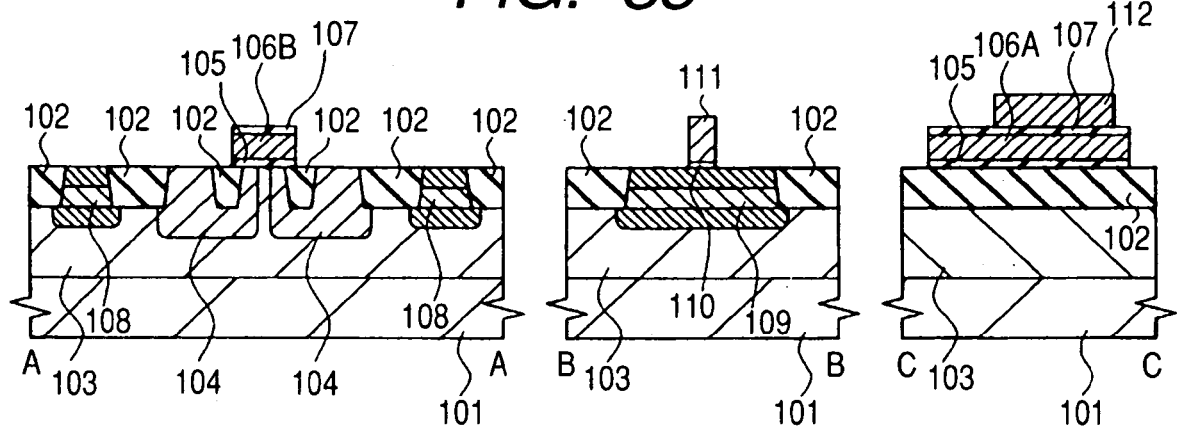
FIG. 35 is a sectional view of principal portions, illustrating the aforesaid process and following FIG. 34.

Next, as shown in FIGS. 29 and 30, a silicon nitride film having a thickness of about 50 nm and a silicon oxide film having a thickness of about 1500 nm are deposited in this order onto the substrate 1 to form an insulating film 28. Then, the insulating film 28 is etched using a photoresist film as a mask to form therein contact holes reaching both n+-type semiconductor region 25 and p+-type semiconductor region 26.

Subsequently, a titanium nitride film is deposited on the substrate 1 including the interiors of the contact holes. Then, a W (tungsten) film is deposited on the substrate 1 to fill up the interiors of the contact holes. Thereafter, the W film and the titanium nitride film on the substrate 1 are removed by a CMP (Chemical Mechanical Polishing) method while allowing both films to remain within the contact holes, thereby forming plugs 29 within the contact holes which plugs are connected electrically to the n+-type semiconductor region 25 and the p+-type semiconductor region 26.

Next, a Ti (titanium) film having a thickness of about 10 nm, a titanium nitride film having a thickness of about 30 nm, an Al (aluminum) film having a thickness of about 400 nm, a Ti film having a thickness of about 10 nm and a titanium nitride film having a thickness of about 20 nm are deposited in this order onto the substrate 1. Then, the resulting laminate film is etched using a photoresist film as a mask to form wiring 30 connected electrically to each plug 29. In this way the semiconductor integrated circuit device according to this embodiment is fabricated. Although an Al film is used as a main conductive layer of the wiring 30, there may be used an Al alloy film containing a predetermined amount of Cu (copper).

Although the present invention has been described above concretely on the basis of an embodiment thereof, it goes without saying that the invention is not limited to the above embodiment, but that various changes may be made within the scope not departing from the gist of the invention.

The semiconductor integrated circuit device and the manufacturing method therefor according to the present invention are applicable to semiconductor integrated circuit devices with both high and low breakdown voltage MISFETs formed on the same substrate, including semiconductor integrated circuit devices incorporating an LCD driver, as well as manufacturing processes therefor.

What is claimed is:

1. A semiconductor integrated circuit device comprising, over one and same substrate: a first MISFET of a first breakdown voltage; and a second MISFET of a second breakdown voltage lower than the first breakdown voltage,
    wherein the first MISFET has, over the semiconductor substrate, a first semiconductor region where a first gate electrode constituted by a first conductive film, a first gate insulating film, a source and a drain are formed,
    wherein the second MISFET has, over the semiconductor substrate, a second gate electrode constituted by a second conductive film,
    wherein an element isolation region is formed in the semiconductor substrate at a position under a side wall of the first gate electrode, and
    wherein the width of the element isolation region in a first direction orthogonal to the extending direction of the first gate electrode is larger than the thickness of the second conductive film in a planar region not overlapping the first gate electrode.

2. A semiconductor integrated circuit device according to claim 1, wherein the width of the element isolation region in the first direction is the sum of the thickness of the second conductive film, the thickness of the first gate insulating film, and an alignment allowance in processing of the first gate electrode.

3. A semiconductor integrated circuit device comprising, over one and same substrate: a first MISFET having a first breakdown voltage as a drain breakdown voltage and a second breakdown voltage as a source breakdown voltage lower than the first breakdown voltage; and a second MISFET of the second breakdown voltage,
    wherein the first MISFET has, over the semiconductor substrate:
        a first semiconductor region where a first gate electrode constituted by a first conductive film, a first gate insulating film, and the drain are formed; and
        a second semiconductor region where the source is formed,
    wherein an element isolation region is formed in the semiconductor substrate at a position under a side wall of the first gate electrode,
    wherein the width of the element isolation region in a direct direction orthogonal to the extending direction of the first gate electrode is larger than the thickness of a second conductive film in a planar region not overlapping the first gate electrode, and
    the second semiconductor region is formed deeper than the element isolation region.

4. A semiconductor integrated circuit device according to claim 3, wherein the width of the element isolation region in the first direction is the sum of the thickness of the second conductive film, the thickness of the first gate insulating film and an alignment allowance in processing of the first gate electrode.

5. A semiconductor integrated circuit device according to claim 3, wherein the second semiconductor region is formed so as to be adjacent to the element isolation region in plan at a position under the first gate electrode.

6. A semiconductor integrated circuit device according to claim 3, wherein the second semiconductor region is formed in a well region of the second MISFET.

7. A semiconductor integrated circuit device according to claim 3, wherein the first semiconductor region is formed in a well region of a third MISFET.

8. A semiconductor integrated circuit device having first and second MISFETs formed over a semiconductor substrate, and further having an element isolation region within the semiconductor substrate,
    wherein the first MISFET has a first source region and a first drain region both formed within the semiconductor substrate and further has the element isolation region formed in the first source region and the first drain region,
    wherein the second MISFET has a first well region formed within the semiconductor substrate and a second source region and a second drain region both formed in the first well region, and
    wherein the depth of the first well region and that of the first source region are the same.

9. A semiconductor integrated circuit device according to claim 8, wherein the first well region and the first source region are each constituted by three semiconductor layers.

10. A semiconductor integrated circuit device according to claim 8, further including a third MISFET,
    wherein the third MISFET has a second well region formed within the semiconductor substrate and a third source region and a third drain region both formed in the second well region, and
    wherein the depth of the second well region and that of the first drain region are the same.

* * * * *